(12) United States Patent
Yasuda et al.

(10) Patent No.: US 8,054,465 B2
(45) Date of Patent: Nov. 8, 2011

(54) POSITION MEASUREMENT METHOD

(75) Inventors: Masahiko Yasuda, Tokyo (JP); Taro Sugihara, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 12/071,254

(22) Filed: Feb. 19, 2008

(65) Prior Publication Data

US 2008/0151257 A1 Jun. 26, 2008

Related U.S. Application Data

(62) Division of application No. 11/730,915, filed on Apr. 4, 2007, which is a division of application No. 11/281,544, filed on Nov. 18, 2005.

(30) Foreign Application Priority Data

Nov. 18, 2004 (JP) .................................. 2004-335050

(51) Int. Cl.
   *G01B 11/00* (2006.01)
(52) U.S. Cl. ..................................................... 356/399
(58) Field of Classification Search .................. None
   See application file for complete search history.

(56) References Cited

U.S. PATENT DOCUMENTS

| | | | |
|---|---|---|---|
| 4,346,164 A | 8/1982 | Tabarelli et al. | |
| 4,480,910 A | 11/1984 | Takanashi et al. | |
| 5,610,683 A | 3/1997 | Takahashi | |
| 5,633,698 A | 5/1997 | Imai | |
| 5,715,039 A | 2/1998 | Fukuda et al. | |
| 5,786,897 A | 7/1998 | Ototake | |
| 5,825,043 A | 10/1998 | Suwa | |
| 6,342,705 B1* | 1/2002 | Li et al. ................... | 356/400 |
| 6,400,445 B2 | 6/2002 | Nishi et al. | |
| 7,301,607 B2 | 11/2007 | Hazelton et al. | |
| 7,352,440 B2 | 4/2008 | Hoogendam et al. | |
| 7,372,538 B2 | 5/2008 | Binnard | |
| 7,397,940 B2 | 7/2008 | Willems van Dijk et al. | |
| 2001/0055117 A1 | 12/2001 | Mizutani | |
| 2004/0149906 A1 | 8/2004 | Mankos et al. | |
| 2004/0165159 A1 | 8/2004 | Lof et al. | |

(Continued)

FOREIGN PATENT DOCUMENTS

DE   221 563 A1   4/1985

(Continued)

OTHER PUBLICATIONS

English machine Translation of JP 10-247681 (1998).*

(Continued)

*Primary Examiner* — Gregory J Toatley
*Assistant Examiner* — Juan D Valentin
(74) *Attorney, Agent, or Firm* — Oliff & Berridge, PLC

(57) ABSTRACT

A part of a plate of a predetermined shape detachably mounted on a moving body is detected by an alignment system while the position of the moving body is measured by a measurement unit that sets a movement coordinate system of the movement body, and based on the detection results and the measurement results of the measurement unit corresponding to the detection results, position information of an outer periphery edge of the plate is obtained. Therefore, even if there are no alignment marks on the moving body for position measurement, the position of the plate, or in other words, the position of the moving body can be controlled on the movement coordinate system set by the measurement unit, based on the position information of the outer periphery edge of the plate.

10 Claims, 19 Drawing Sheets

U.S. PATENT DOCUMENTS

| | | |
|---|---|---|
| 2004/0263809 A1 | 12/2004 | Nakano |
| 2004/0263823 A1 | 12/2004 | Klomp et al. |
| 2005/0016818 A1 | 1/2005 | Ito et al. |
| 2005/0219489 A1 | 10/2005 | Nei et al. |
| 2005/0259234 A1 | 11/2005 | Hirukawa et al. |
| 2005/0264774 A1 | 12/2005 | Mizutani et al. |
| 2005/0280791 A1 | 12/2005 | Nagasaka et al. |
| 2006/0126038 A1 | 6/2006 | Hoogendam et al. |
| 2006/0146306 A1 | 7/2006 | Nagasaka et al. |
| 2007/0216893 A1 | 9/2007 | Yasuda et al. |
| 2008/0151214 A1 | 6/2008 | Yasuda et al. |
| 2008/0151267 A1 | 6/2008 | Yasuda et al. |
| 2010/0134779 A1 | 6/2010 | Yasuda et al. |

FOREIGN PATENT DOCUMENTS

| | | |
|---|---|---|
| DE | 224 448 A1 | 7/1985 |
| EP | 1 571 696 A1 | 9/2005 |
| EP | 1 571 697 A1 | 9/2005 |
| EP | 1 598 855 A1 | 11/2005 |
| JP | A-58-202448 | 11/1983 |
| JP | A-59-019912 | 2/1984 |
| JP | A-59-19912 | 2/1984 |
| JP | A-62-65326 | 3/1987 |
| JP | A-62-065326 | 3/1987 |
| JP | A-63-157419 | 6/1988 |
| JP | A-4-305915 | 10/1992 |
| JP | A-4-305917 | 10/1992 |
| JP | A-4-306915 | 10/1992 |
| JP | A-5-62877 | 3/1993 |
| JP | A-5-062877 | 3/1993 |
| JP | A-6-124873 | 5/1994 |
| JP | A-7-220990 | 8/1995 |
| JP | A-8-316125 | 11/1996 |
| JP | 10247681 A * | 9/1998 |
| JP | A-10-247681 | 9/1998 |
| JP | A-10-303114 | 11/1998 |
| JP | A-10-340846 | 12/1998 |
| JP | A-11-176727 | 7/1999 |
| JP | A-2000-058436 | 2/2000 |
| JP | A-2000-58436 | 2/2000 |
| JP | A 2004-207696 | 7/2004 |
| JP | A 2004-207710 | 7/2004 |
| JP | A-2004-207710 | 7/2004 |
| JP | A 2004-259966 | 9/2004 |
| WO | WO 99/49504 A1 | 9/1999 |
| WO | WO 2004/019128 A2 | 3/2004 |
| WO | WO 2004/053954 A1 | 6/2004 |
| WO | WO 2004/053955 A1 | 6/2004 |
| WO | WO 2004/086468 A1 | 10/2004 |
| WO | WO 2004/090577 A2 | 10/2004 |
| WO | WO 2005/010611 A2 | 2/2005 |

OTHER PUBLICATIONS

Nov. 29, 2007 Office Action in U.S. Appl. No. 11/281,544.
Mar. 9, 2009 Notice of Allowance in U.S. Appl. No. 12/071,261.
May 7, 2009 Notice of Withdrawal from Issue in U.S. Appl. No. 12/071,261.
Dec. 18, 2009 Office Action issued in U.S. Appl. No. 11/281,544.
Office Action issued in U.S. Appl. No. 11/730,915 on Jan. 10, 2008.
Mar. 17, 2010 Office Action issued in U.S. Appl. No. 12/071,262.
Office Action cited in related U.S. Appl. No. 12/071,261, dated Apr. 15, 2010.
Office Action dated Feb. 9, 2011 issued in Japanese Application No. 2006-545156 (with translation).
Jul. 29, 2010 Office Action cited in U.S. Appl. No. 11/281,544.
Feb. 28, 2006 Written Opinion of the International Searching Authority issued in International Application No. PCT/JP2005/021214 (with translation).
Mar. 23, 2011 Notice of Allowance issued in U.S. Appl. No. 11/281,544.
Mar. 9, 2011 Office Action issued in U.S. Appl. No. 12/071,262.
Feb. 9, 2011 Supplementary European Search Report for European Patent Application No. 05807063.2.
Mar. 23, 2011 Notice of Allowance issued in U.S. Appl. No. 11/284,544.
Mar. 25, 2009 Office Action in related U.S. Appl. No. 11/281,544.
Jun. 26, 2008 Office Action in related U.S. Appl. No. 11/281,544.
Aug. 6, 2009 Office Action in related U.S. Appl. No 11/730,915.
Jan. 23, 2009 Office Action in related U.S. Appl. No. 11/730,915.
Apr. 17, 2008 Office Action in related U.S. Appl. No. 11/730,915.
Aug. 6, 2008 Office Action in related U.S. Appl. No. 12/071,261.
May 14, 2009 Office Action in related U.S. Appl. No. 12/071,261.
Jun. 3, 2009 Office Action in related U.S. Appl. No. 12/071,262.
Aug. 20, 2008 Office Action in related U.S. Appl. No. 12/071,262.
Jul. 15, 2011 Office Action issued in Japanese Patent Application No. 2006-545156 (with translation).

* cited by examiner

POSITION MEASUREMENT METHOD

This is a Division of application Ser. No. 11/730,915 filed Apr. 4, 2007 which is a divisional of application Ser. No. 11/281,544 filed Nov. 18, 2005. The disclosures of the prior applications are hereby incorporated by reference herein in their entirety.

BACKGROUND OF THE INVENTION

1. Field of the Invention

The present invention relates to position measurement methods, position control methods, measurement methods, loading methods, exposure methods and exposure apparatus, and device manufacturing methods, and more particularly to a position measurement method in which position information of a plate mounted freely detachable on a moving body is measured, a position control method that uses the position measurement method, a measurement method in which information related to a plate where an opening is formed in order to mount an object is measured, a loading method that uses the measurement method, an exposure method that utilizes the loading method and an exposure apparatus suitable for performing each of the methods described above, and a device manufacturing method that uses the exposure apparatus or the exposure method.

2. Description of the Related Art

Conventionally, in a lithography process for manufacturing electronic devices such as a semiconductor device (an integrated circuit or the like), a liquid crystal display device, or the like, a reduction projection exposure apparatus (the so-called stepper) by the step-and-repeat method that transfers a pattern formed on a mask or a reticle (hereinafter generally referred to as a 'reticle') onto a photosensitive object such as a wafer or a glass plate (hereinafter generally referred to as a 'wafer') on which a resist (a photosensitive agent) is coated, or a projection exposure apparatus (the so-called scanning stepper) by the step-and-scan method is mainly used.

Due to higher integration and finer circuit patterns of the semiconductor devices, in order to improve the resolution of the projection optical system equipped in the projection exposure apparatus, the wavelength of the exposure light (exposure wavelength) is becoming shorter while the numerical aperture (NA) of the projection optical system is gradually increasing. Meanwhile, depth of focus is becoming smaller, due to such shorter exposure wavelength and increasing numerical aperture (larger NA). The exposure wavelength is presumed to be shorter in the future, and if such a situation continues, the depth of focus may become so small that margin shortage may occur during the exposure operation.

Therefore, as a method of substantially shortening the exposure wavelength while increasing (widening) the depth of focus when compared with the depth of focus in the air, the exposure apparatus that utilizes the immersion exposure method is beginning to gather attention. As the exposure apparatus that utilizes the immersion method, an exposure apparatus that performs exposure in a state where the space between the lower surface of the projection optical system and the wafer surface is locally filled with liquid such as water or an organic solvent is known (refer to, for example, the pamphlet of International Publication No. WO99/49504). In the exposure apparatus according to the pamphlet, the resolution is improved utilizing the fact that the wavelength of the exposure light in the liquid becomes 1/n of the wavelength in the air (n is the refractive index of the liquid which is normally around 1.2 to 1.6), and also the depth of focus is substantially increased n times when compared with the case where the same resolution is obtained by a projection optical system (supposing that such a projection optical system can be made) that does not employ the immersion method. That is, the depth of focus can be substantially increased n times than in the air.

Recently, in wafer stages of the exposure apparatus, a proposal has been made of disposing a freely detachable plate that forms a flat section substantially flush with the wafer in the periphery of the wafer held by the wafer stage. In the case of using such a detachable plate in the wafer stage, the position of the plate has to be precisely known.

In addition, in the case of using such plate in the wafer stage, an opening (such as an opening with a circular shape in the case of a semiconductor wafer) for positioning the wafer has to be formed in the center of the plate. However, for example, in the case the degree of roundness of the circular opening of the plate is low and the circular shape is deformed or in an ellipse, the gap between the circumferential surface of the wafer and the inner circumference surface of the opening becomes uneven, and inconveniences could occur, such as the wafer coming into contact with the inner wall surface of the opening of the plate, or not being able to insert the wafer into the opening of the plate.

In addition, because the gap between the inner wall surface of the opening of the plate and the wafer is extremely small, smooth loading operation of the wafer will be difficult if the relative position of the wafer and the plate is not accurately aligned when loading the wafer.

In addition, in the case of the exposure apparatus that utilizes the immersion method, there was the risk of the liquid flowing into parts where the gap between the inner circumference edge of the opening of the plate and the outer circumferential edge of the wafer is large.

SUMMARY OF THE INVENTION

According to a first aspect of the present invention, there is provided a first position measurement method in which position information of a plate of a predetermined shape detachably mounted on a moving body is measured, the position measurement method comprising: an outer periphery edge position obtaining process where a part of the plate is detected while a position of the moving body is measured by a measurement unit that sets a movement coordinate system of the movement body, and position information of an outer periphery edge of the plate is also obtained, based on detection results of the plate and measurement results of the measurement unit corresponding to the detection results.

According to this method, a part of the plate is detected while the position of the moving body on which the plate with a predetermined shape is detachably mounted is measured by the measurement unit that sets the movement coordinate system of the movement body, and based on the detection results and the measurement results of the measurement unit corresponding to the detection results, the position information of the outer periphery edge of the plate is obtained. Therefore, the position of the outer periphery edge of the plate can be controlled on the movement coordinate system set by the measurement unit.

According to a second aspect of the present invention, there is provided a position control method in which the position of a moving body where a plate is detachably mounted is controlled, wherein the position of the moving body is controlled, based on position information of the outer periphery edge of the plate measured using the position measurement method according to the present invention.

According to this method, because the position of the moving body is controlled based on the position information of the outer periphery edge of the plate measured using the position measurement method according to the present invention, the position of the object can be controlled taking into consideration the position of the outer periphery edge of the plate.

The position control method of the present invention can be used, for example, to control the position of a moving body on which an object subject to exposure is placed in an exposure apparatus. Accordingly, it can also be said from a third aspect that the present invention is a first exposure apparatus that uses the position control method of the present invention.

According to a fourth aspect of the present invention, there is provided a measurement method in which information on a plate where an opening is formed to place an object, the plate being detachably mounted on a moving body, is measured, the measurement method comprising: an inner periphery edge position obtaining process where a part of the plate is detected and position information of an inner periphery edge of the opening is obtained, based on detection results of the plate.

According to this method, a part of the plate where the opening is formed to place the object is detected, the plate being detachably mounted on the moving body, and based on the detection results the position information of the inner periphery edge of the opening is obtained. Therefore, based on the position information on the inner periphery edge, it becomes possible to calculate the position and the shape of the opening.

According to a fifth aspect of the present invention, there is provided a first loading method in which an object is loaded on a moving body where a plate that has an opening to place an object is detachably mounted, wherein the object is loaded into the opening of the plate on the moving body, based on position information of the inner periphery edge of the opening of the plate obtained using the measurement method according to the present invention.

According to this method, the object is loaded into the opening of the plate on the moving body, based on the position information of the inner periphery edge of the opening of the plate obtained using the measurement method of the present invention. Accordingly, it becomes easy to load the object to the opening of the plate on the moving body.

According to a sixth aspect of the present invention, there is provided a first exposure method in which an object is exposed, the exposure method comprising: a loading process in which the object is loaded into an opening in the plate on a moving body using the loading method according to the present invention; and an irradiation process in which an exposure beam is irradiated on the object loaded on the moving body.

According to this method, the object is loaded into the opening of the plate on the moving body using the first loading method of the present invention, and exposure is performed irradiating the exposure beam on the object loaded on the moving body.

According to a seventh aspect of the present invention, there is provided a second loading method in which an object subject to processing is loaded into a depressed section on an upper end section of a moving body, the loading method comprising: a placing process in which an object is placed in the depressed section on the moving body; and an obtaining process in which information on a position relation between an inner periphery edge of the depressed section and the object placed within the depressed section is obtained.

In this case, 'object' is a concept that includes the object subject to processing. More specifically, in the placing process, an object subject to processing may be placed within the depressed section on the moving body, or other objects, such as an object used only for the purpose of obtaining the position relation described above may be placed.

In any case, in the obtaining process, the information on the position relation between the inner periphery edge of the depressed section and the object placed within the depressed section is obtained. Accordingly, based on the position relation that has been obtained, it becomes possible to load the object in the depressed section of the moving body at a predetermined positional relation.

According to an eighth aspect of the present invention, there is provided a second exposure method in which an object subject to processing is exposed, the exposure method comprising: a placing process in which the object subject to processing is placed within a depressed section of a moving body using the second loading method according to the present invention; and an irradiation process in which an exposure beam is irradiated on the object subject to processing placed within the depressed section of the moving body.

According to this method, the object subject to processing is placed into the depressed section on the moving body using the second loading method of the present invention, and exposure is performed irradiating the exposure beam on the object subject to exposure placed in the depressed section of the moving body.

According to a ninth aspect of the present invention, there is provided a second exposure apparatus that irradiates an exposure beam on an object, the exposure apparatus comprising: a first stage on which a plate of a predetermined shape is detachably mounted a position measurement system that measures a position of the first stage; a detection unit that can detect a part of the first stage; and an outer periphery edge position obtaining unit that detects a part of the plate using the detection unit while measuring a position of the first stage using the position measurement system, and based on detection results of the plate and measurement results of the position measurement system corresponding to the detection results, obtains position information of an outer periphery edge of the plate.

According to this apparatus, the outer periphery edge position obtaining unit detects a part of the plate using the detection unit, while measuring the position of the first stage on which the plate having a predetermined shape is detachably mounted using the position measurement system, and also obtains the position information of the outer periphery edge of the plate based on the detection results and the measurement results of the position measurement system corresponding to the detection results. Therefore, it becomes possible to control the position of the outer periphery edge of the plate mounted on the first stage on a movement coordinate system set by the position measurement system.

According to a tenth aspect of the present invention, there is provided a third exposure apparatus that irradiates an exposure beam on an object, the exposure apparatus comprising: an exposure stage on which a plate of a predetermined shape having an opening formed where the object is placed is mounted; a position measurement system that measures a position of the exposure stage; a detection unit that can detect a part of the exposure stage; and an inner periphery edge position obtaining unit that detects a part of the plate using the detection unit while measuring a position of the exposure stage using the position measurement system, and based on detection results of the plate and measurement results of the position measurement system corresponding to the detection results, obtains position information of an inner periphery edge of the opening.

According to this apparatus, the inner periphery edge position obtaining unit detects a part of the plate using the detection unit, while measuring the position of the exposure stage using the position measurement system, and also obtains the position information of the inner periphery edge of the opening based on the detection results and the measurement results of the position measurement system corresponding to the detection results. Therefore, it becomes possible to obtain the information of the position and shape of the opening, based on the position information of the inner periphery edge.

In the lithography process, by using the first to third exposure apparatus of the present invention, a pattern can be formed on an object with good precision, which allows microdevices to be manufactured with good yield. Similarly, in the lithography process, by using the first and second exposure methods of the present invention, a pattern can be formed on an object with good precision, which allows microdevices to be manufactured with good yield. Accordingly, further from another aspect, the present invention can also be said to be a device manufacturing method that uses one of the first to third exposure apparatus of the present invention, or either the first or second exposure method of the present invention.

BRIEF DESCRIPTION OF THE DRAWINGS

In the accompanying drawings.

DESCRIPTION OF THE EMBODIMENT

An embodiment of the present invention is described below, referring to FIGS. 1 to 17B.

Figure 1:
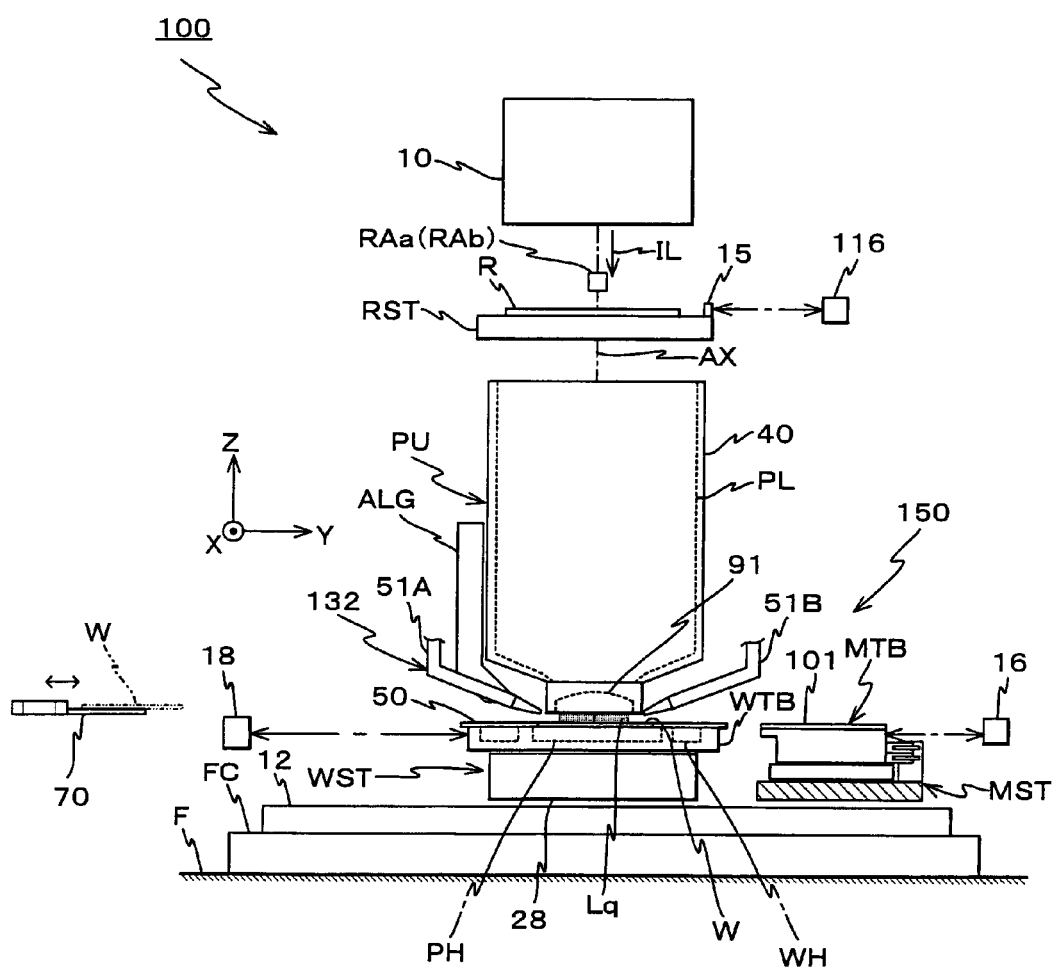
FIG. 1 is a view that shows a schematic configuration of an exposure apparatus in an embodiment.

FIG. 1 shows a schematic configuration of an exposure apparatus 100 in an embodiment that is suitable for performing a position measurement method, a position control method, a measurement method, a loading method, and an exposure method related to the present invention. Exposure apparatus 100 is a projection exposure apparatus by the step-and-scan method, that is, the so-called scanning stepper (also called a scanner). Exposure apparatus 100 is equipped with an illumination system 10, a reticle stage RST that holds reticle R, a projection unit PU, a stage unit 150 that has a wafer stage WST and a measurement stage MST, a control system for these parts, and the like. On wafer stage WST, a wafer W is to be mounted.

As is disclosed in, for example, Kokai (Japanese Unexamined Patent Application Publication) No. 2001-313250 and its corresponding U.S. Patent Application Publication No. 2003/0025890 description or the like, illumination system 10 includes an illuminance uniformity optical system, which includes parts such as a light source and an optical integrator (a fly-eye lens, an internal reflection type integrator, a diffractive optical element, and the like). Illumination system 10 also includes a beam splitter, a relay lens, a variable ND filter, a reticle blind, and the like (all of which are not shown). As long as the national laws in designated states or elected states, to which this international application is applied, permit, the above disclosures of the publication and the U.S. patent application publication description are incorporated herein by reference.

In illumination system 10, a slit-shaped illumination area set by the reticle blind on reticle R is illuminated with a substantially uniform illuminance by an illumination light (exposure light) IL. In this case, for example, an ArF excimer laser beam (wavelength: 193 nm) is used as illumination light IL.

On reticle stage RST, reticle R on which a circuit pattern or the like is formed on its pattern surface (the lower surface in FIG. 1) is fixed, for example, by vacuum suction or the like. Reticle stage RST is driven by a reticle stage drive system 11 (not shown in FIG. 1, refer to FIG. 6), which includes parts such as linear motors, and the stage can be finely driven within an XY plane perpendicular to the optical axis of illumination system 10 (coincides with an optical axis AX of a projection optical system PL that will be described later). Reticle stage RST is also drivable at a designated scanning speed in a predetermined scanning direction (in this case, a Y-axis direction, which is the lateral direction of the page surface in FIG. 1).

The position (including rotation around a Z-axis) of reticle stage RST within a stage movement plane is constantly detected at a resolution of, e.g., around 0.5 to 1 nm, by a reticle laser interferometer (hereinafter referred to as a 'reticle interferometer') 116, via a movable mirror 15 (in actual, a Y movable mirror that has a reflection surface orthogonal to the Y-axis direction and an X movable mirror that has a reflection surface orthogonal to an X-axis direction are arranged). The measurement values of reticle interferometer 116 are sent to a main controller 20 (not shown in FIG. 1, refer to FIG. 6), and based on the measurement values, main controller 20 calculates the position of reticle stage RST in the X-axis direction, the Y-axis direction, and a θz direction (rotation direction around the Z-axis), as well as control the position (and speed) of reticle stage RST by controlling reticle stage drive system 11, based on the calculation results. Instead of movable mirror 15, the end surface of reticle stage RST may be mirror polished so as to form a reflection surface (corresponding to the reflection surface of movable mirror 15).

Above reticle R, a pair of reticle alignment detection systems RAa and RAb, each constituted by a TTR (Through The Reticle) alignment optical system, is arranged in the X-axis direction at a predetermined distance. With this system, the light of the exposure wavelength is used to observe a pair of reticle alignment marks on reticle R and a pair of fiducial marks on measurement stage MST corresponding to the reticle alignment marks (hereinafter referred to as 'a first fiducial mark') at the same time, via projection optical system PL. As reticle alignment detection systems RAa and RAb, systems having a structure similar to the ones disclosed in, for example, Kokai (Japanese Unexamined Patent Application Publication) No. 7-176468 and the corresponding U.S. Pat. No. 5,646,413, are used. As long as the national laws in designated states (or elected states), to which this international application is applied, permit, the above disclosures of the publication and the U.S. patent are incorporated herein by reference.

Projection unit PU is arranged below reticle stage RST in FIG. 1. Projection unit PU includes a barrel 40 and projection optical system PL, which consists of a plurality of optical elements held in a predetermined positional relation within barrel 40. As projection optical system PL, a dioptric system is used, consisting of a plurality of lenses (lens elements) that share an optical axis AX in the Z-axis direction. Projection optical system PL is, for example, a both-side telecentric dioptric system that has a predetermined projection magnification (such as one-quarter or one-fifth times) is used. Therefore, when illumination light IL from illumination system 10 illuminates the illumination area on reticle R, illumination light IL that has passed through reticle R forms a reduced image of the circuit pattern within the illumination area on reticle R (a partial reduced image of the circuit pattern) on wafer W whose surface is coated with a resist (photosensitive agent), on an area (exposure area) conjugate with the illumination area, via projection unit PU (projection optical system PL).

In exposure apparatus 100 of the embodiment, because exposure is performed by applying the immersion method, the opening on the reticle side becomes larger with the substantial increase of the numerical aperture NA. Therefore, in a dioptric system consisting only of lenses, it becomes difficult to satisfy the Petzval condition, which tends to lead to an increase in the size of the projection optical system. In order to prevent such an increase in the size of the projection optical system, a catodioptric system that includes mirrors and lenses may also be used.

In addition, in exposure apparatus 100 of the embodiment, because exposure is performed by applying the immersion method, in the vicinity of a lens 91 (hereinafter also referred to as a 'tip lens') that constitutes a part of projection optical system PL located closest to the image plane (close to wafer W), a liquid supply nozzle 51A and a liquid recovery nozzle 51B that constitute a part of an immersion mechanism 132 is arranged.

To liquid supply nozzle 51A, a supply pipe (not shown) that has one end connecting to a liquid supply unit 88 (not shown in FIG. 1, refer to FIG. 6) is connected, whereas to liquid recovery nozzle 51B, a recovery pipe (not shown) that has one end connecting to a liquid recovery unit 92 (not shown in FIG. 1, refer to FIG. 6) is connected.

Liquid supply unit 88 includes a tank for the liquid, a compression pump, a temperature control unit, valves for controlling the supply/suspension of the liquid to the supply pipes, and the like. As the valves, for example, it is desirable to use flow control valves so that not only the supply/suspension of the liquid but also the flow rate of the liquid can be adjusted. The temperature control unit adjusts the temperature of the liquid in the liquid tank so that the temperature of the liquid is substantially around the same level as the temperature within the chamber (not shown) where the exposure apparatus main body is housed.

Exposure apparatus 100 does not have to fully equip the tank for the liquid, the compression pump, the temperature control unit, the valves, and the like, and at least a part of such components can be substituted by the equipment in the factory where exposure apparatus 100 is installed.

Liquid recovery unit 92 includes a tank for the liquid and a suction pump, and valves for controlling the recovery/suspension of the liquid via the recovery pipes, and the like. As the valves, it is desirable to use flow control valves, corresponding to the valves on the liquid supply unit 88 side.

Exposure apparatus 100 does not have to fully equip the tank for the liquid, the suction pump, the valves, and the like, and at least a part of such components can be substituted by the equipment in the factory where exposure apparatus 100 is installed.

As the liquid above, in this case, pure water (hereinafter, simply referred to as 'water' except for cases when further reference is necessary) that transmits the ArF excimer laser beam (light having the wavelength of 193 nm) will be used. Pure water can be obtained easily by large quantity in a semiconductor manufacturing site or the like, and is also good for the photoresist on the wafer and the optical lenses because there are no adverse effects.

Refractive index n of the water to the ArF excimer laser beam is approximately 1.44. In such water, the wavelength of illumination light IL is shortened to 193 nm×1/n=around 134 nm.

Figure 6:
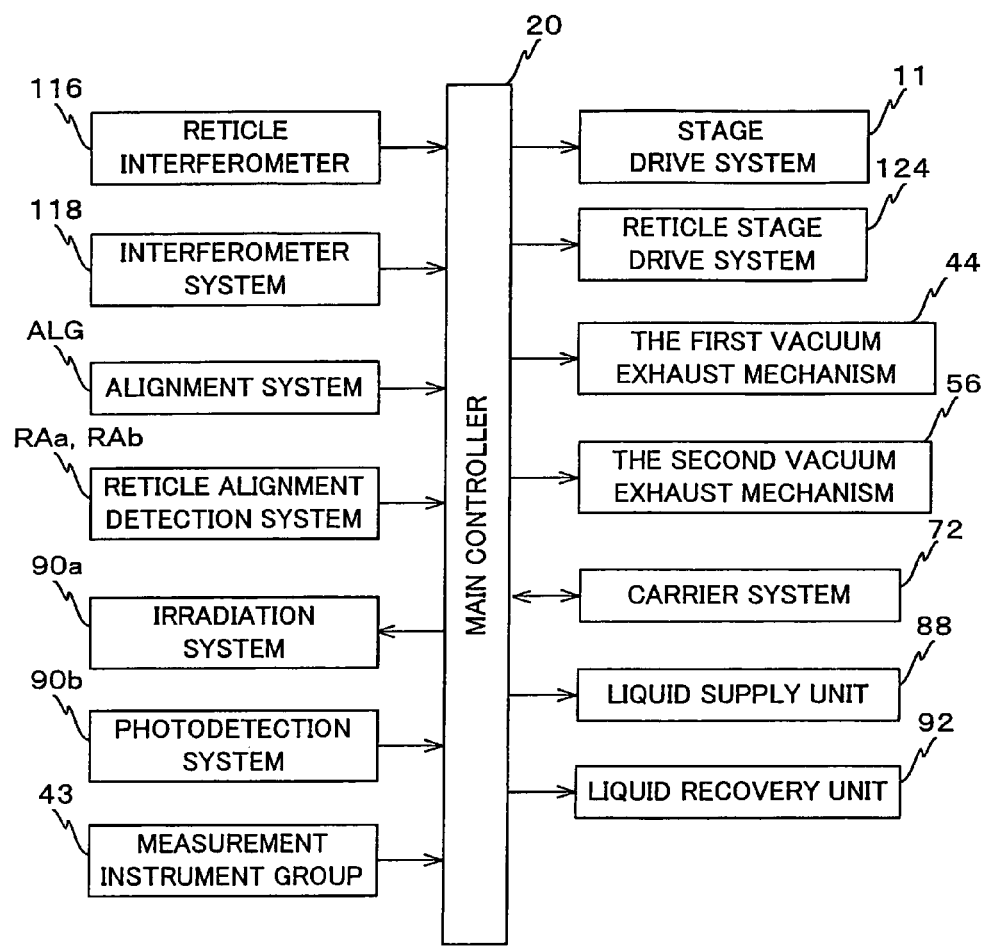
FIG. 6 is a block diagram that shows a main arrangement of a control system of an exposure apparatus in an embodiment.

Liquid supply unit 88 and liquid recovery unit 92 are each equipped with a controller, and the controllers operate under the control of main controller 20 (refer to FIG. 6). In response to the instructions from main controller 20, the controller of liquid supply unit 88 opens the valve connecting to the supply pipe to a predetermined degree, and then supplies the water between tip lens 91 and wafer W (or a plate that will be described later) via liquid supply nozzle 51A. In addition, at this point, the controller of liquid supply unit 92 opens the valve connecting to the recovery pipe to a predetermined degree in response to the instructions from main controller 20, and then recovers the water from between tip lens 91 and wafer W into liquid recovery unit 92 (the liquid tank) via liquid recovery nozzle 51B. At this point, main controller 20 gives instructions to the controller of liquid supply unit 88 and the controller of liquid recovery unit 92 so that the amount of water supplied between tip lens 91 and wafer W from liquid supply nozzle 51A and the amount of water recovered via liquid recovery nozzle 51B is constantly equal. Accordingly, a constant amount of water Lq (refer to FIG. 1) is held between tip lens 91 and wafer W. In this case, water Lq held between tip lens 91 and wafer W is constantly circulated.

As is obvious from the description so far, immersion mechanism 132 is a local immersion mechanism that includes liquid supply unit 88, liquid recovery unit 92, supply pipes, recovery pipes, liquid supply nozzle 51A, liquid recovery nozzle 51B, and the like, and in the case of exposing wafer W, a liquid immersion area is formed on a part of wafer W.

Even in the case measurement stage MST is located below projection unit PU, it is possible to fill in the water between measurement table MTB (to be described later) and tip lens 91 as in the description above.

In the description above, only one liquid supply nozzle and one liquid recovery nozzle were arranged for the sake of simplicity. However, the arrangement is not limited to this, and for example, an arrangement that has a plurality of nozzles may be employed, as is disclosed in the pamphlet of International Publication No. WO99/49504. The point is, any arrangement may be employed as long as the liquid can be supplied between optical member (tip lens) 91 at the tip of projection optical system PL and wafer W. For example, the immersion mechanism disclosed in the pamphlet of International Publication No. WO2004/053955, or the immersion mechanism disclosed in the European Patent Application Publication No. 1420298 description may also be applied to the exposure apparatus in this embodiment.

Stage unit 150 is equipped with a frame caster FC, a base platform 12 arranged on frame caster FC, wafer stage WST and measurement stage MST arranged above the upper surface of base platform 12, an interferometer system 118 (refer to FIG. 6) that includes interferometers 16 and 18 for measuring the positions of stage WST and stage MST, and a stage drive system 124 (refer to FIG. 6) for driving stages WST and MST.

Figure 2:
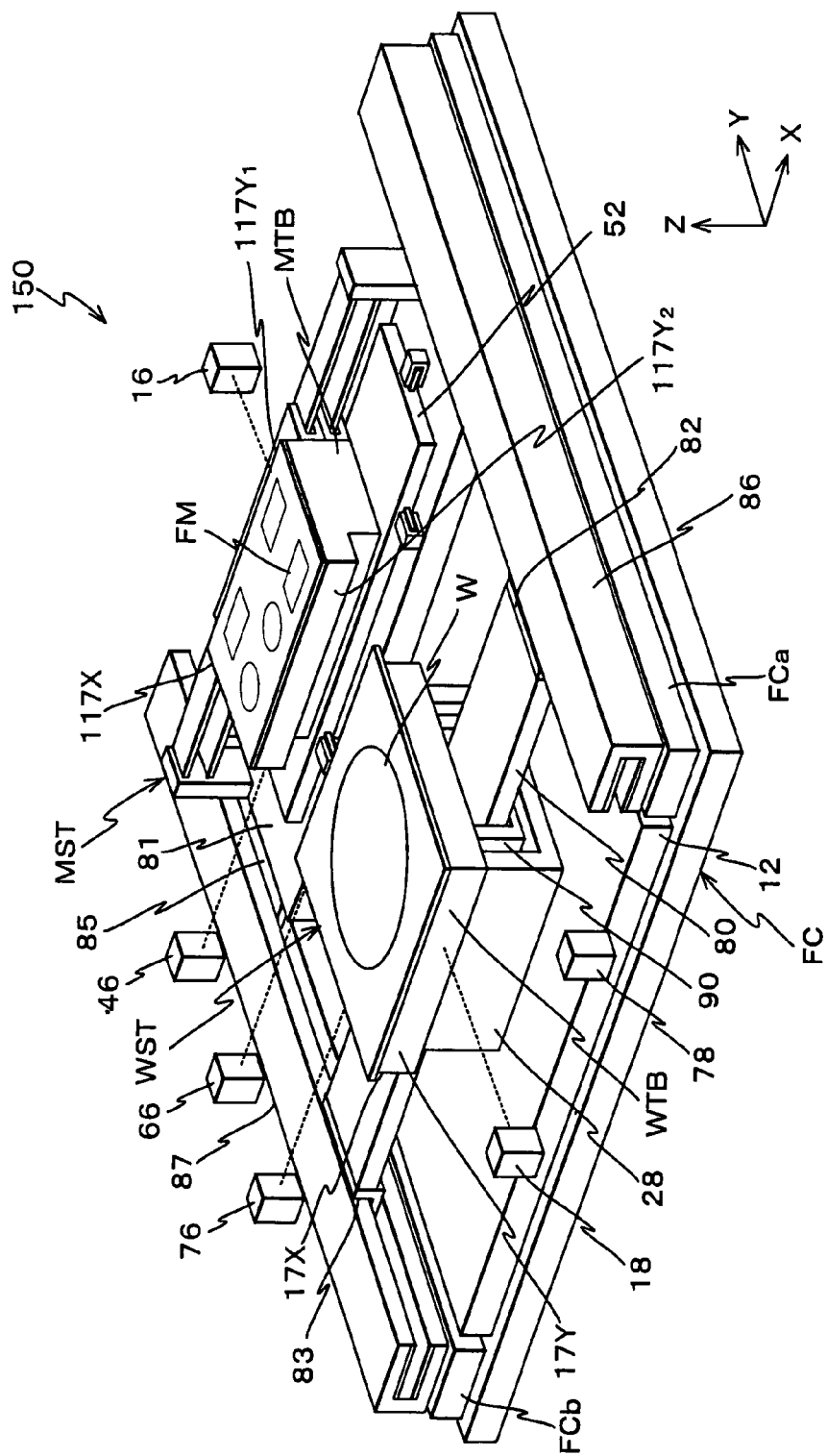
FIG. 2 is a perspective view that shows a stage unit in FIG. 1.

As is obvious from FIG. 2, which is a perspective view of stage unit 150, frame caster FC is composed of a roughly plate-shaped member, on which protruding sections FCa and FCb whose longitudinal direction is in the Y-axis direction are integrally formed in the vicinity of the edge sections on both sides in the X-axis direction.

Base platform 12 is composed of a plate-shaped member, which is also referred to as a surface table, and is arranged on an area between protruding sections FCa and FCb of frame caster FC. The degree of flatness of the upper surface of base platform 12 is extremely high, and the upper surface serves as a guide surface when wafer stage WST and measurement stage MST moves.

As is shown in FIG. 2, wafer stage WST is equipped with a wafer stage main body 28 arranged above base platform 12, and a wafer table WTB mounted on wafer stage main body 28 via a Z-tilt drive mechanism (not shown). In actual, Z-tilt drive mechanism includes three actuators (e.g., voice coil motors) or the like that support wafer table WTB on wafer stage main body 28, and Z-tilt drive mechanism finely drives wafer table WTB in directions of three degrees of freedom, in the Z-axis direction, a θx direction (rotation direction around the X-axis), and a θy direction (rotation direction around the Y-axis).

Wafer stage main body 28 is composed of a hollow member extending in the X-axis direction that has a rectangular framed sectional shape. On the lower surface of wafer stage main body 28, a plurality of (e.g., four) gas hydrostatic bearings (not shown) such as air bearings is arranged, and wafer stage WST is supported in a non-contact manner via the bearings, via a clearance of around several μm above the guide surface previously described.

As is shown in FIG. 2, above protruding section FCa of frame caster FC, a Y-axis stator 86 is arranged, extending in the Y-axis direction. Similarly, above protruding section FCb of frame caster FC, a Y-axis stator 87 is arranged, extending in the Y-axis direction. Y-axis stators 86 and 87 are supported by levitation by the gas hydrostatic bearings (not shown) such as air bearings arranged on the lower surface of the stators, via a predetermined clearance with respect to the upper surface of protruding sections FCa and FCb. In the embodiment, Y-axis stators 86 and 87 are each configured by a magnetic pole unit that has a plurality of permanent magnets arranged along the Y-axis direction at a predetermined distance.

Inside wafer stage main body 28, a mover 90 is installed, consisting of a magnetic pole unit whose cross-sectional shape resembles the letter U and having a plurality of permanent magnets arranged along the X-axis direction at a predetermined distance.

In the space inside mover 90, an X-axis stator 80 extending in the X-axis direction is inserted. X-axis stator 80 is configured by an armature unit that has a plurality of armature coils arranged along the X-axis direction at a predetermined distance. In this case, mover 90 consisting of the magnetic pole unit and X-axis stator 80 consisting of the armature unit constitute a moving magnet type X-axis linear motor that drives wafer stage WST in the X-axis direction. Hereinafter, the X-axis linear motor will be appropriately referred to as an X-axis linear motor 80, using the same reference numeral as its stator (the stator for the X-axis), X-axis stator 80. As the X-axis linear motor, a moving coil type linear motor may also be used, instead of the moving magnet type linear motor.

On both ends of X-axis stator 80 in the longitudinal direction, for example, movers 82 and 83 consisting of armature units incorporated with a plurality of armature coils arranged along the Y-axis direction at a predetermined distance are respectively fixed. Movers 82 and 83 are each inserted into Y-axis stators 86 and 87 from the inside. That is, in the embodiment, movers 82 and 83 consisting of the armature units and Y-axis stators 86 and 87 consisting of the magnetic pole units constitute two Y-axis linear motors of a moving coil type. Hereinafter, the two Y-axis linear motors will be appropriately referred to as Y-axis linear motor 82 and Y-axis linear motor 83, using the same reference numerals as the movers, Y-axis movers 82 and 83. As the Y-axis linear motors 82 and 83, linear motors of the moving magnet type may also be used.

That is, wafer stage WST is driven in the X-axis direction by X-axis liner motor 80, and is also driven in the Y-axis direction integrally with X-axis linear motor 80 by the pair of Y-axis linear motors 82 and 83. In addition, by slightly changing the drive force in the Y-axis direction generated by Y-axis linear motors 82 and 83, wafer stage WST can also be rotationally driven in the θz direction.

Figure 4:
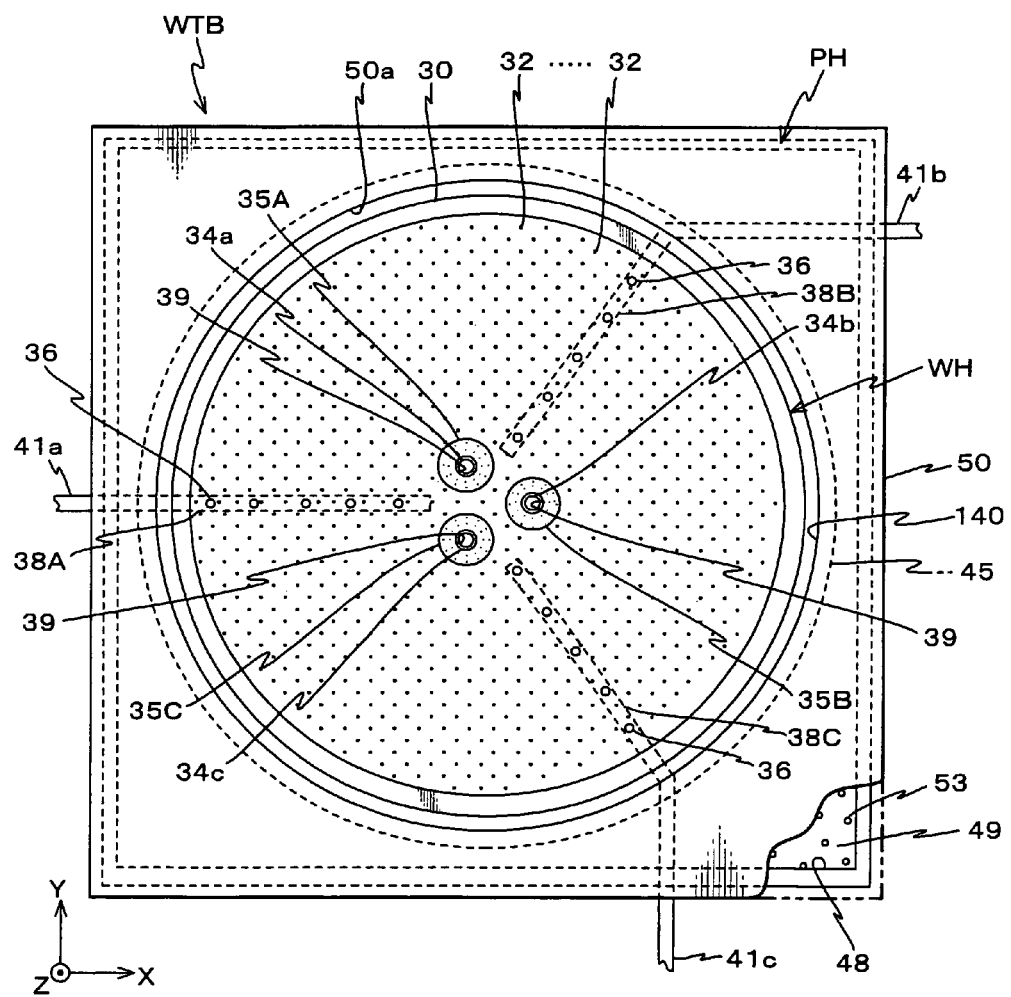
FIG. 4 is a planar view that shows a wafer table.

As is shown in the planar view of FIG. 4, wafer table WTB is virtually a square shape in a planar view, and on the upper surface, a wafer holder WH by the pin chuck method that holds wafer W and a plate holder PH is arranged.

As is shown in FIG. 4, wafer holder WH is equipped with a plurality of first pins 32 arranged at a predetermined distance within a circular area of a predetermined dimension in the center of the upper surface of wafer table WTB, a first rim section 30 consisting of a ring-shaped protruding section that surrounds the circular area in which the plurality of first pins are arranged, three cylindrical shaped second rim sections 35A, 35B, and 35C that are respectively projecting at the apex positions of a virtually equilateral triangle where the distance from the center of the circular area (holder center) is the same, and the like. The tip of each of the first pins 32 and the upper end surface of the second rim sections 35A, 35B, and 35C are set at substantially the same height.

In each of the inner circumference of the second rim sections 35A, 35B, and 35C, a through hole 39 that has a circular shape in a planar view is formed, and inside through holes 39, vertical movement pins (center ups) 34a, 34b, and 34c that have a columnar shape are respectively arranged movable in the vertical direction (the Z-axis direction, which is the direction orthogonal to the page surface of FIG. 4). The three center ups 34a to 34c can be moved up and down in the vertical direction (the Z-axis direction, which is the direction orthogonal to the page surface of FIG. 4) simultaneously by the same amount, via a vertical movement mechanism (not shown) that constitutes a part of stage drive system 124 (refer to FIG. 6). On wafer loading/unloading, by center ups 34a to 34c being driven by the vertical movement mechanism, wafer W can be supported from below by center ups 34a to 34c, or can be vertically moved in the supported state.

As is shown in FIG. 4, in the circular area surrounded by the first rim section 30 on the upper surface of wafer table WTB, a plurality of exhaust ports 36 are formed, arranged radially (in three radial line directions spaced apart at a center angle of substantially 1200) from the center of the circular area (holder center) at a predetermined distance. Exhaust ports 36 are formed at positions that do not interfere with the first pins 32. Each exhaust port 36 connects to exhaust paths 38A, 38B, and 38C, which are formed inside wafer table WTB, via the piping directly under the ports, and exhaust paths 38A, 38B, and 38C connect to a first vacuum exhaust mechanism 44 (refer to FIG. 6), via vacuum exhaust piping 41a, 41b, and 41c, respectively.

In the embodiment, when wafer W is loaded on wafer holder WH on wafer table WTB, main controller 20 begins a vacuum exhaust operation via the first vacuum exhaust mechanism 44. And, by this operation, a negative state is created inside the space surrounded by wafer W, the first rim section 30, and the three second rim sections 35A, 35B, and 35C, and wafer W is held by suction by the plurality of the first pins 32, the first rim section 30, and the three second rim sections 35A, 35B, and 35C.

On the upper surface of wafer table WTB on the outer side of the first rim section 30, a third rim section 45 is formed, consisting of a ring-shaped protruding section concentric with the first rim section 30. On the outer side of the third rim section 45, a depressed section 49 is formed whose inner side is divided by the third rim section 45 and the outer side is surrounded by an outer partition wall 48 of wafer table WTB. On the inner bottom surface of depressed section 49, a plurality of second pins 53 whose tips are substantially the same height as the third rim section 45 and outer partition wall 48 is arranged at a predetermined distance. In this case, the height of the upper end surface of the third rim section 45 and outer partition wall 48 is set a little lower than the height of the first rim section 30. And, on the third rim section 45, outer partition wall 48, and the plurality of second pins 53 that are configured as is described above, a substantially square liquid-repellent plate (e.g., a water-repellent plate) 50 that has a circular opening 50a in the center is detachably mounted. Liquid-repellent plate 50 is mounted on wafer table WTB in a state where the entire outer periphery of liquid-repellent plate 50 projects outward a little than outer partition wall 48. That is, plate holder PH by the pin chuck method that holds liquid-repellent plate 50 is configured including the third rim section 45, outer partition wall 48, and the plurality of second pins 53 that are arranged on the upper surface of wafer table WTB.

In the area constituting a part of plate holder PH, divided by the third rim section 45 and outer partition wall 48 where the plurality of second pins 53 are arranged, a plurality of exhaust ports (not shown) are arranged similarly to wafer holder WH described above at a predetermined distance, and each exhaust port connects to exhaust paths (not shown) formed inside wafer table WTB, via the piping directly under the ports, and these exhaust paths connect to a second vacuum exhaust mechanism 56 shown in FIG. 6, via the respective vacuum exhaust piping (not shown).

In the embodiment, main controller 20 vacuum suctions the inside of the space surrounded by liquid-repellent plate 50, the third rim section 45, and the outer partition wall 48 (the inner space of depressed section 49) via the second vacuum exhaust mechanism 56, so that the liquid-repellent plate 50 is held by suction by plate holder PH. In order to make liquid-repellent plate 50 easily detachable, for example, vertical movement pins similar to center ups 34a to 34c may be arranged within the space above, and main controller 20 may control the drive mechanism of the vertical movement pins.

In the embodiment, the height of each parts that respectively constitute wafer holder WH and plate holder PH is set so that the upper surface of liquid-repellent plate 50 held by suction on plate holder PH described above and the surface of wafer W held by suction on wafer holder WH are substantially flush (refer to FIG. 1). In addition, the inner circumferential edge of opening 50a of liquid-repellent plate 50 substantially coincides with the inner circumference wall of the third rim section 45, when liquid-repellent plate 50 is in a state held by plate holder PH. That is, in the embodiment, on the inner side of the third rim section 45 and the inner wall surface of opening 50a of liquid-repellent plate 50, a depressed section 140 where wafer W is loaded is formed, and in depressed section 140, wafer holder WH is arranged. In addition, the shape and size of opening 50a is set so that the clearance between the outer circumferential edge of wafer W and the inner circumferential edge of opening 50a of liquid-repellent plate 50 is a value around 0.1 to 0.4 mm. In addition, in a state where wafer W is held by wafer holder WH, a surface that appears to be completely flat is formed on the upper surface of wafer table WTB.

Wafer table WTB is made of a material that has a low thermal expansion rate, such as ceramics or the like, which has a certain level of elasticity, and by etching the surface of a substantially square material such as ceramics, the first rim section 30, the second rim sections 35A, 35B, and 35C, the third rim section 45, the plurality of first pins 32, and the plurality of second pins 53 are integrally formed.

On the surface of liquid-repellent plate 50, a liquid-repellent treatment (in this case, water-repellent treatment such as water-repellent coating) that uses fluorine-containing material is applied, and a liquid-repellent surface (a water-repellent surface) is formed. The liquid-repellent (water-repellent) surface of liquid-repellent plate 50 is generally sensitive to light in the far ultraviolet region or the vacuum ultraviolet region, and the irradiation of exposure light (illumination light) IL deteriorates the liquid-repellent (water-repellent) performance. In addition, because traces of liquid (such as water marks) may be formed on the upper surface of liquid-repellent plate 50, liquid-repellent plate 50 is made easily detachable (exchangeable). Incidentally, besides than the vacuum suction method, liquid-repellent plate 50 may also be held by other methods such as the electrostatic suction method.

In addition, a resist (a photosensitive agent) is coated on the surface of wafer W. In the embodiment, as an example, a photosensitive agent for the ArF excimer laser that has liquid repellency (water repellency, contact angle 80° to 85°) is used as the photosensitive agent. As a matter of course, a material for forming a topcoat layer that has liquid repellency (contact angle to the liquid, 90° to 120°) may be coated on this photosensitive agent. Incidentally, the surface of wafer W does not necessarily have to be liquid-repellent, and a resist whose contact angle to the liquid is around 60° to 80° may also be used. In addition, the liquid-repellent treatment may be applied also to the side surface and a part of the back surface of wafer W. Similarly, the liquid-repellent treatment may be applied also to at least a part of wafer holder WH and plate holder PH.

The position of wafer table WTB configured in the manner described above is measured by interferometer system 118 (refer to FIG. 6). Details on the measurement will be described later in the description.

As is shown in FIG. 2, measurement stage MST is configured combining a plurality of components such as a Y stage 81 whose longitudinal direction is the X-axis direction. Measurement stage MST is supported in a non-contact manner via a clearance of several μm above the upper surface (guide surface) of base platform 12 via a plurality of gas hydrostatic bearings such as air bearings arranged in the lowest surface (the lower surface of the member closest to base platform 12).

Figure 3:
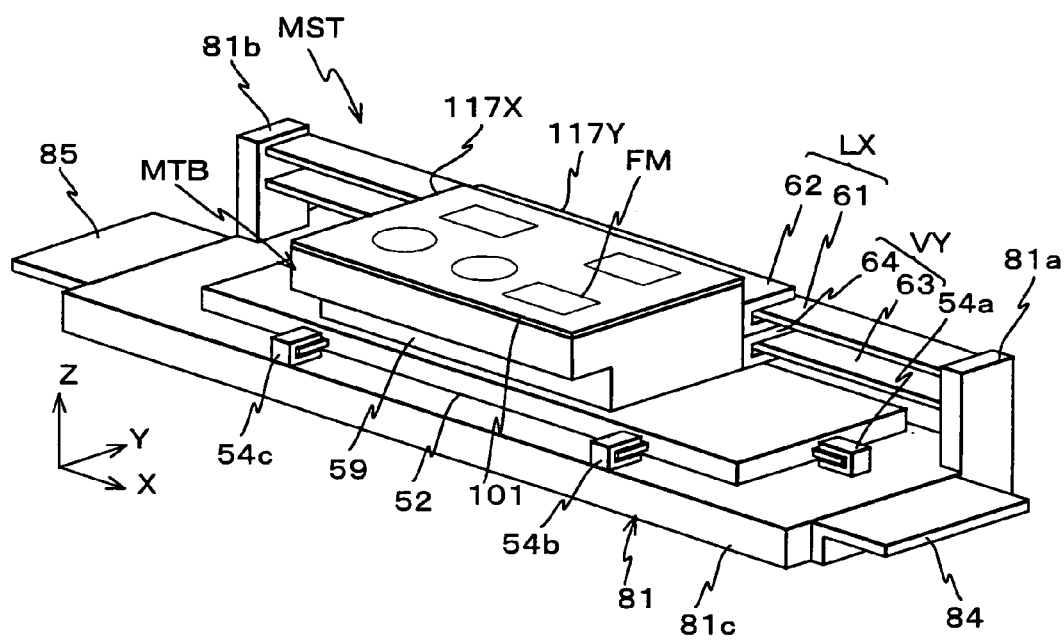
FIG. 3 is a perspective view that shows a measurement stage in FIG. 1.

As is obvious from the perspective view in FIG. 3, measurement stage MST is equipped with a measurement stage main body 81c that has a rectangular plate shape extending narrowly in the X-axis direction, Y stage 81 that has a pair of protruding sections 81a and 81b respectively fixed on both ends of the upper surface of measurement stage main body 81c in the X-axis direction, a leveling table 52 arranged above the upper surface of measurement stage main body 81c, and measurement table MTB installed above leveling table 52.

On the end surface of both one end and the other end of measurement stage main body 81c, which constitutes a part of Y stage 81, in the X-axis direction, movers 84 and 85 consisting of armature units that incorporate a plurality of armature coils arranged along the Y-axis direction at a predetermined distance are respectively fixed. Movers 84 and 85 are inserted inside Y-axis stators 86 and 87, respectively. That is, in the embodiment, movers 84 and 85 consisting of armature units and Y-axis stators 86 and 87 consisting of magnetic pole units in which movers 84 and 85 are respectively inserted constitute two moving coil type Y-axis linear motors. Hereinafter, the two Y-axis linear motors described above will be appropriately referred to as Y-axis linear motor 84 and Y-axis linear motor 85, using the same reference numerals as the movers 84 and 85. In the embodiment, Y-axis linear motors 84 and 85 drive the entire measurement stage MST in the Y-axis direction. As the Y-axis linear motors 82 and 83, linear motors of the moving magnet type may also be used.

On the bottom surface of measurement stage main body 81c, the plurality of gas hydrostatic bearings is arranged. On the upper surface of measurement stage main body 81c on both one side and the other side in the X-axis direction on the edge near the +Y side, the pair of protruding sections 81a and 81b is fixed facing each other. In between protruding sections 81a and 81b, stators 61 and 63 each extending in the X-axis direction within the XY plane are installed, arranged in the Z-axis direction (vertically) at a predetermined distance.

On the end surface of leveling table 52 on the +X side, a mover of an X voice coil motor 54a is arranged, and the stator of X voice coil motor 54a is fixed to the upper surface of measurement stage main body 81c. Further, on the end surface of leveling table 52 on the −Y side, movers of Y voice coil motors 54b and 54c are respectively arranged, and the stators of Y voice coil motors 54b and 54c are fixed to the upper surface of measurement stage main body 81c. X voice coil motor 54a is configured of, for example, a mover composed of a magnetic pole unit and a stator composed of an armature unit, and a drive force in the X-axis direction is generated by an electromagnetic interaction between the mover and the stator. In addition, Y voice coil motors 54b and 54c are also similarly configured, and a drive force in the Y-axis direction is generated. That is, leveling table 52 is driven in the X-axis direction with respect to Y stage 81 by X voice coil motor 54a, as well as in the Y-axis direction with respect to Y stage 81 by Y voice coil motors 54b and 54c. In addition, by slightly changing the drive force generated by Y voice coil motors 54b and 54c, leveling table 52 can also be rotationally driven around the Z-axis (the θz direction) with respect to Y stage 81.

Inside leveling table 52, three Z voice coil motors (drawing omitted) are arranged that generate a drive force in the Z-axis direction.

That is, leveling table 52 is finely drivable in a non-contact manner in directions of six degrees of freedom (in the X, Y, Z, θx, θy, and θz directions) by X voice coil motor 54a, Y voice coil motors 54b and 54c, and the Z voice coil motors (not shown) arranged inside leveling table 52.

Referring back to FIG. 3, measurement table MTB is equipped with a measurement table main body 59, and movers 62 and 64 that are fixed to the surface of measurement table main body 59 on the +Y side in a vertical arrangement, the movers having a rough sectional shape of a letter U whose longitudinal direction is the X-axis direction.

Mover 62 is equipped with a mover yoke that has a rough U-shape in a YZ section, and a permanent magnet group consisting of a plurality of sets of an N-pole permanent magnet and a S-pole permanent magnet alternately arranged at a predetermined distance along the X-axis direction on the inner surface (the upper and lower surface) of the mover yoke, and is in a state engaged with stator 61 previously described. In the inner space of the mover yoke of mover 62, an alternating magnetic field is formed along the X-axis direction. Stator 61, for example, consists of an armature unit that incorporates a plurality of armature coils arranged at a predetermined distance along the X-axis direction. That is, stator 61 and mover 62 constitute a moving magnet type X-axis linear motor LX that drives measurement table MTB in the X-axis direction.

Mover 64 is equipped with a mover yoke that has a rough U-shape in the YZ section, and an N-pole permanent magnet and a S-pole permanent magnet arranged one by one on the inner surface (the upper and lower surface) of the mover yoke, and is in a state engaged with stator 63 previously described. In the inner space of the mover yoke of mover 64, a magnetic field is formed in the +Z direction (or the −Z direction). Stator 63 is equipped with an armature coil, which is arranged in an arrangement where the current flows only in the X-axis direction in a magnetic field formed by the N-pole magnet and the S-pole magnet. That is, mover 64 and stator 63 constitute a moving magnet type Y voice coil motor VY that drives measurement table MTB in the Y-axis direction.

As is obvious from the description so far, in the embodiment, Y-axis linear motors 82 to 85, X-axis linear motor 80, Z-tilt drive mechanism (not shown) that drives wafer table WTB, and each of the motors described above on measurement stage MST (54a to 54c, LX, VY, and the Z voice coil motor (not shown)) constitute stage drive system 124. The various drive mechanisms that constitute stage drive system 124 operate under the control of main controller 20 shown in FIG. 6.

Measurement table MTB is further equipped with measurement instruments for performing various measurement related to exposure. More particularly, as is shown in FIG. 3, on the upper surface of measurement table main body 59, a plate 101 made of glass material such as Zerodur (brand name of Schott Corporation) or fused silica glass is arranged. On plate 101, chrome is coated on substantially the entire surface, and on plate 101, an area for the measurement instruments, a high and low reference reflecting surface area used when measuring reticle transmittance or the like, and a fiducial mark area on which a plurality of fiducial marks are formed like the ones disclosed in, Kokai (Japanese Unexamined Patent Application Publication) No. 5-21314 and the corresponding U.S. Pat. No. 5,243,195 description, or in Kokai (Japanese Unexamined Patent Application Publication) No. 10-050600 and the corresponding U.S. Pat. No. 6,243,158 description, are arranged. The fiducial mark area constitutes a measurement member. The surface of plate 101 is a flat plane. As long as the national laws in designated states (or elected states), to which this international application is applied, permit, the above disclosures of the publication and the U.S. patent description are incorporated herein by reference.

In the area for the measurement instruments, patterning is performed, and various measurement aperture patterns are formed. As the measurement aperture patterns, for example, patterns such as an aerial image measurement pattern (e.g., a slit-shaped aperture pattern), an irregular illumination measurement pinhole aperture pattern, an illuminance measurement aperture pattern, a wavefront aberration measurement aperture pattern, and the like are formed.

Inside measurement table main body 59 under the aerial image measurement pattern, a light-receiving system is arranged, which receives exposure light (illumination light) IL via the aerial image measurement pattern, irradiated on plate 101 via projection optical system and the water. The light-receiving system constitutes an aerial image measurement instrument, which measures the light intensity of an aerial image (projected image) of a pattern projected by projection optical system PL. The details of the instrument are disclosed in, for example, Kokai (Japanese Unexamined Patent Application Publication) No. 2002-14005 and the corresponding U.S. Patent Application Publication No. 2002/0041377 Description. As long as the national laws in designated states (or elected states), to which this international application is applied, permit, the above disclosures of the publication and the U.S. patent application description are incorporated herein by reference.

Further, inside measurement table main body 59 under the irregular illumination measurement pinhole aperture pattern, a light-receiving system that includes a light-receiving element is arranged. The light-receiving system including the light-receiving element constitutes an irregular illuminance measurement instrument, which has a pinhole-shaped light-receiving section that receives illumination light IL on the image plane of projection optical system PL. The details of the instrument are disclosed in, for example, Kokai (Japanese Unexamined Patent Application Publication) No. 57-117238 and the corresponding U.S. Patent Publication No. 4,465,368 Description. As long as the national laws in designated states (or elected states), to which this international application is applied, permit, the above disclosures of the publication and the U.S. patent description are incorporated herein by reference.

Further, inside measurement table main body 59 under the illuminance measurement aperture pattern, a light-receiving system that includes a light-receiving element is arranged. The light-receiving system including the light-receiving element constitutes an illuminance monitor, which has a light-receiving section of a predetermined area that receives illumination light IL on the image plane of projection optical system PL via the water. The details of the instrument are disclosed in, for example, Kokai (Japanese Unexamined Patent Application Publication) No. 11-16816 and the corresponding U.S. Patent Application Publication No. 2002/0061469 Description. As long as the national laws in designated states (or elected states), to which this international application is applied, permit, the above disclosures of the publication and the U.S. patent application description are incorporated herein by reference.

Further, inside measurement table main body 59 under the wavefront aberration measurement aperture pattern, for example, a light-receiving system that includes a microlens array is arranged. The light-receiving system including the microlens array constitutes a wavefront aberration measurement instrument. The details of the instrument are disclosed in, for example, the pamphlet of International Publication No. WO99/60361, and the corresponding European Patent Publication No. 1,079,223 Description. As long as the national laws in designated states (or elected states), to which this international application is applied, permit, the above disclosures of the publication and the European Patent description are incorporated herein by reference.

In FIG. 6, the aerial image measurement instrument, the irregular illumination measurement instrument, the illuminance monitor, and the wavefront aberration measurement instrument described above are shown as measurement instrument group 43.

In the embodiment, in response to the immersion exposure where wafer W is exposed by exposure light (illumination light) IL via projection optical system PL and the water, the instruments used for measurement as in the illuminance monitor, the irregular illumination measurement instrument, the aerial image measurement instrument, and the wavefront aberration measurement instrument described above that use illumination light IL will receive illumination light IL via projection optical system PL and the water. Therefore, a water-repellent coating may be performed on the surface of plate 101. In addition, in each of the measurement instruments described above, only a part of each measurement instrument, such as the optical system, may be installed in measurement stage MST, or the whole instrument may be arranged in measurement stage MST. In addition, all of the aerial image measurement instrument, the irregular illumination measurement instrument, the illuminance monitor, and the wavefront aberration measurement instrument do not necessarily have to be equipped, and only a part of the instruments may be equipped as necessary.

The position of measurement stage MST (measurement table MTB) that has the arrangement described above is measured by interferometer system 118 (refer to FIG. 6), which will be described later in the description.

In addition, as the holding member that holds projection unit PU, an off-axis alignment system (hereinafter shortly referred to as 'alignment system') ALG as is shown in FIG. 1 is arranged. As alignment system ALG, for example, a sensor of an FIA (Field Image Alignment) system based on an image-processing method is used. This sensor irradiates a broadband detection beam that does not expose the resist on the wafer on an object mark, picks up an image of the object mark formed on the photodetection surface by the reflection light from the object mark and an image (not shown) of an index (an index pattern on an index plate arranged within alignment system ALG) with a pick-up device (such as a CCD), and outputs the imaging signals. Details on such a system are disclosed in, for example, Kokai (Japanese Unexamined Patent Application Publication) No. 2001-257157 and its corresponding U.S. Patent Application Publication No. 2001/0023918 description, Kokai (Japanese Unexamined Patent Application Publication) No. 8-213306 and its corresponding U.S. Pat. No. 5,783,833 description, or the like. The imaging signals from alignment system ALG are sent to main controller 20 in FIG. 6. As long as the national laws in designated states or elected states, to which this international application is applied, permit, the above disclosures of the publications and the U.S. patent application publication description and the U.S. patent are incorporated herein by reference.

As alignment system ALG, the system is not limited to the FIA system, and it is naturally possible to use an alignment sensor that irradiates a coherent detection light on an object mark and detects the scattered light or diffracted light generated from the object mark, or a sensor that detects two diffracted lights (for example, the same order) generated from an object mark that are made to interfere independently, or appropriately combined.

To members such as optical elements of alignment system ALG or holding members of the optical elements that are arranged in the vicinity of the movement plane of wafer table WTB and have the risk of the liquid remaining on the members when the liquid disperses, a waterproof cover may be arranged. In addition, in a gap where there is a risk of the liquid entering inside alignment system ALG such as between an optical element and a holding member that holds the optical element, a seal member such as an O-ring is arranged. Furthermore, the surface of the optical members arranged in the vicinity of the movement plane of wafer table WTB, such as the surface of the optical element the tip (lower end) of alignment system ALG and the surface of the mirror used by the interferometer fixed to alignment system ALG, is coated with a liquid-repellent material, which not only prevents the water from adhering, but also allows the operator to easily wipe off the water when the water adheres.

Furthermore, in exposure apparatus 100 of the embodiment, although it is omitted in FIG. 1, a multiple point focal position detection system based on an oblique method including an irradiation system 90*a* and a photodetection system 90*b* (refer to FIG. 6), similar to the one disclosed in, for example, Kokai (Japanese Patent Unexamined Application Publication) No. 6-283403 and the corresponding U.S. Pat. No. 5,448,332 description, is arranged. In the embodiment, as an example, irradiation system 90*a* is supported by suspension on the −X side of projection unit PU by a holding member that holds projection unit PU, while photodetection system 90*b* is also supported by suspension under the holding member on the +X side of projection unit PU. That is, irradiation system 90*a* and photodetection system 90*b*, and projection optical system PL are attached to the same member, and the positional relation between the two is constantly maintained. As long as the national laws in designated states or elected states, to which this international application is applied, permit, the above disclosures of the publication and the U.S. patent description are incorporated herein by reference.

Next, the configuration and the operation of interferometer system 118 will be described.

The end surfaces of wafer table WTB are mirror-polished on the −X side and the −Y side, and as is shown in FIG. 2, reflection surfaces 17X and 17Y are formed. In addition, the end surfaces of measurement table MTB are mirror-polished on the −X side, and the +Y side and the −Y side, and reflection surfaces 117X, and 117Y$_1$ and 117Y$_2$ are formed.

Figure 5:
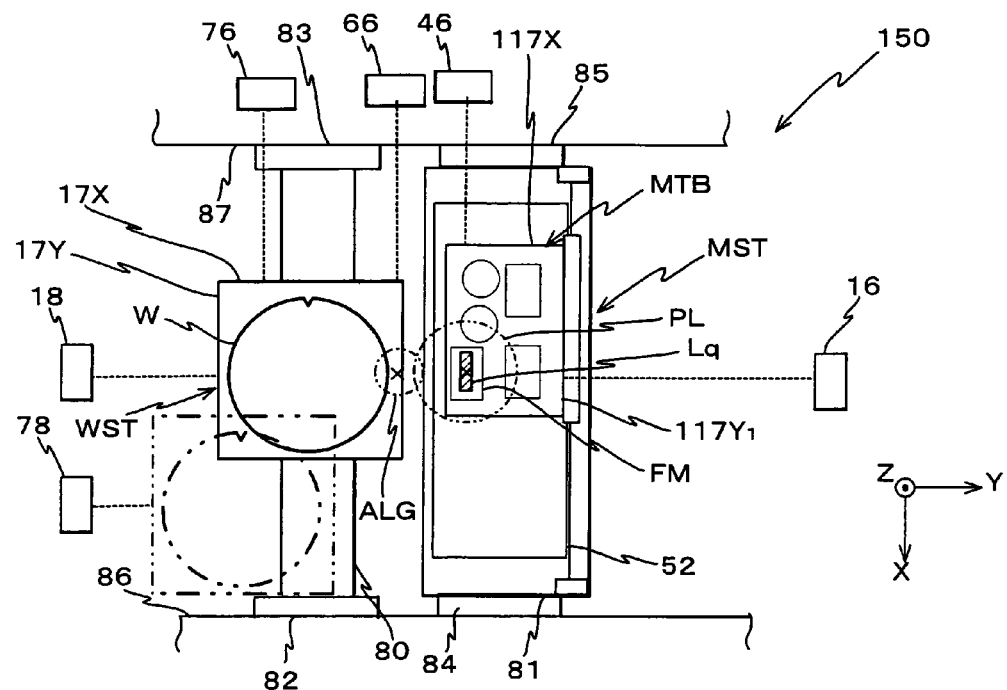
FIG. 5 is a view for describing an arrangement of an interferometer system.

As is shown in FIG. 5, interferometer system 118 includes Y-axis interferometers 16, 18, and 78, and X-axis interferometers 46, 66, and 76.

Y-axis interferometers 16 and 18 both have measurement axes that are parallel to the Y-axis connecting the projection center of projection optical system PL (optical axis AX) and the detection center of alignment system ALG. Y-axis interferometers 16 and 18 are both multi-axis interferometers that have at least three optical axes, and the output values of each optical axis can be independently measured. In addition, X-axis interferometer 46 has measurement axes that perpendicularly intersect with the measurement axes of Y-axis interferometers 16 and 18 at the projection center of projection optical system PL. In addition, X-axis interferometer 66 has measurement axes that perpendicularly intersect with the measurement axes of Y-axis interferometers 16 and 18 at the detection center of alignment system AGL. X-axis interferometers 46 and 66 are both multi-axis interferometers that have at least two optical axes, and the output values of each optical axis can be independently measured. The output values (measurement values) of the above four interferometers 16, 18, 46, and 66 are sent to main controller 20 shown in FIG. 6. For example, in the state shown in FIG. 5, the interferometer beam (measurement beam) from Y-axis interferometer 16 is projected on reflection surface 117Y$_1$ of measurement table MTB while the interferometer beam (measurement beam) from Y-axis interferometer 18 is projected on reflection surface 17Y of wafer table WTB, and the interferometer beam (measurement beam) from X-axis interferometer 46 is projected on reflection surface 117X of measurement table MTB while the interferometer beam (measurement beam) from X-axis interferometer 66 is projected on reflection surface 17X of wafer table WTB. And by respectively receiving the reflection beams of the measurement beams of the optical axis of each interferometer from each reflection surface, interferometers 16, 18, 46, and 66 measure the displacement for each optical axis in the measurement direction from the reference position (normally, a fixed mirror is arranged on the side surface of projection unit PU or off-axis alignment system ALG (refer to FIGS. 6 and 5), which serves as a reference plane) of each reflection surface.

In the case of FIG. 5, based on the output values of Y-axis interferometer 18, main controller 20 measures not only the position of wafer table WTB in the Y-axis direction (the Y position), but also the rotation amount around the X-axis (pitching amount) and the rotation amount around the Z-axis (yawing amount). In addition, based on the output values of Y-axis interferometer 16, main controller 20 measures not only the position of measurement table MTB in the Y-axis direction (the Y position), but also the rotation amount around the X-axis (pitching amount) and the rotation amount around the Z-axis (yawing amount). Further, based on the output values (measurement values) of X-axis interferometer 66, main controller 20 measures not only the position of wafer table WTB in the X-axis direction (the X position), but also the rotation amount around the Y-axis (rolling amount). Furthermore, based on the output values (measurement values) of X-axis interferometer 46, main controller 20 measures the X position and the rolling amount of measurement table MTB.

As is obvious from FIG. 5, in the embodiment, the interferometer beam from Y-axis interferometer 18 is constantly projected on a movable mirror 17Y in the entire movement range of wafer stage WST on alignment and on exposure, whereas the interferometer beam from Y-axis interferometer 16 is constantly projected on a movable mirror 117Y$_1$ in the entire movement range of measurement stage MST. Accordingly, for the Y-axis direction, the Y position of stages WST and MST is controlled by main controller 20 based on the measurement values of Y-axis interferometers 18 and 16, except for the case when wafer stage WST moves to the wafer exchange position shown by the double-dotted line in FIG. 5.

Meanwhile, as is obvious from FIGS. 2 and 5, main controller 20 controls the X position of wafer table WTB (wafer stage WST) based on the output of X-axis interferometer 46 within the range where only the interferometer beam from X-axis interferometer 46 irradiates reflection surface 17X, while controlling the X position of measurement table MTB (measurement stage MST) based on the output of X-axis interferometer 46 within the range where only the interferometer beam from X-axis interferometer 46 irradiates reflection surface 117X. In addition, main controller 20 controls the X position of wafer table WTB (wafer stage WST) based on the output of X-axis interferometer 66 within the range where only the interferometer beam from X-axis interferometer 66 irradiates reflection surface 17X, while controlling the X position of measurement table MTB (measurement stage MST) based on the output of X-axis interferometer 66 within the range where only the interferometer beam from X-axis interferometer 66 irradiates reflection surface 117X.

In addition, in the range including where the interferometer beams from both X-axis interferometer 46 and X-axis interferometer 66 irradiate reflection surface 17X, main controller 20 controls the X position of wafer table WTB (wafer stage WST) on wafer alignment using X-axis interferometer 66, whereas main controller 20 also controls the X position of wafer table WTB (wafer stage WST) on exposure using X-axis interferometer 46. Accordingly, on both wafer alignment and on exposure, the X position of wafer table WTB (wafer stage WST) can be controlled without any Abbe errors.

The remaining X-axis interferometer 76 and Y-axis interferometer 78 are interferometers that are used to control the position of wafer stage WST when wafer stage WST is located in the vicinity of the wafer exchange position, which is outside the control of interferometers 46, 66, and 18. Main controller 20 controls the position of wafer table WTB (wafer stage WST) based on the measurement values of interferometers 76 and 78, during the period when the X position cannot be controlled based on the output values of interferometers 46, 66, and 18.

In addition, when measurement stage MST is at a waiting position further on the +Y side than the state in FIG. 5, the interferometer beams of both X-axis interferometer 66 and X-axis interferometer 46 do not irradiate reflection surface 117X. When measurement stage MST moves from this state in the −Y direction, immediately after the point when the interferometer beam of X-axis interferometer 46 begins to irradiate reflection surface 117x from the state where it does not irradiate reflection surface 117X, main controller 20 resets X-axis interferometer 46, which has not been used so far for control, and thereinafter, controls the X position of measurement table MTB (measurement stage MST) using X-axis interferometer 46. The other interferometers can perform reset (seamless reset) operation using the output (measurement values) of adjacent interferometers. That is, immediately before resetting each interferometer, at the point where the measurement beams from adjacent two interferometers simultaneously begins to irradiate the reflection surface, by resetting (presetting) the interferometer subject to reset with the measurement values of the X-axis interferometer or the Y-axis interferometer that has been used for position control of wafer stage WST or measurement stage MST carried over, the position of wafer stage WST and measurement stage MST can be controlled using the interferometer that has been reset without any problems. As a matter of course, when measurement table MTB is at a waiting position, an interferometer for measuring the X-axis position of measurement table MTB may be added.

Furthermore, in exposure apparatus 100 of the embodiment, the wafer exchange position (the loading position) is decided at a position in the movable range of wafer stage WST in the vicinity of the edge section on the +X side and the vicinity of the edge section on the −Y side, and reticle alignment and baseline measurement of alignment system ALG are to be performed when wafer stage WST is located at the wafer exchange position. When wafer stage WST is at the wafer exchange position, because the interferometer beam (measurement beam) from Y-axis interferometer 18 irradiates reflection surface $117Y_2$ of measurement table MTB, main controller 20 resets the measurement values of Y-axis interferometer 18 prior to the irradiation. And then, main controller 20 begins the series of operations related to reticle alignment and baseline measurement of alignment system ALG, while controlling the position of measurement table MTB using the Y-axis interferometer 18 that has been reset and X-axis interferometer 46. This is because by measuring the baseline using fiducial mark area FM on measurement table MTB previously described while controlling the position of measurement table MTB using Y-axis interferometer 18, which is used for measuring the position of wafer table WTB (wafer stage WST) on wafer alignment and exposure, and by performing position control of wafer table WTB on exposure using the baseline that has been measured, position errors caused by the difference in interferometers used for control can be kept from occurring.

In the embodiment, on reticle alignment, main controller 20 controls the open/close operation of each valve in liquid supply unit 88 and liquid recovery unit 92 of immersion mechanism 132 as is previously described, and water Lq is constantly filled in the space between tip lens 91 of projection optical system PL and fiducial mark area FA of measurement table MTB. Then, main controller 20 detects the relative position (a first relative position) between at least a pair of reticle alignment marks on reticle R and at least a pair of first fiducial marks on fiducial mark area FM, using reticle alignment detection systems RAa and RAb, and then after the detection, moves measurement table MTB based on the design values of the baseline until fiducial mark area FM comes directly under alignment system ALG. Then, in a state where water Lq does not exist on fiducial mark area FM, main controller 20 detects a second fiducial mark on fiducial mark area FM using alignment system ALG, and the relative position (a second relative position) between the detection center of alignment system ALG and the second fiducial mark. Then, main controller 20 calculates the baseline of alignment system ALG, based on the first relative position, the second relative position, the design values of the baseline, and the positional relation between the pair of first fiducial marks and the second fiducial mark.

In the embodiment, the three Y-axis interferometers 16, 18, and 78 and the three X-axis interferometers 46, 66, and 76 constitute interferometer system 118. However, the configuration of such an interferometer system is a mere example, and the present invention is naturally not limited to this.

Referring back to FIG. 1, in exposure apparatus 100, a carrier arm 70 is arranged that carries wafer W to wafer stage WST. Carrier arm 70 may be an arm by a slide method or a robot arm of a horizontal multijoint type, as long as it carries the wafer between a pre-alignment unit (not shown) that detects the center position and the rotation angle of the wafer and wafer stage WST located at the wafer exchange position. In the embodiment, a carrier system 72 (refer to FIG. 6) that carries the wafer to wafer stage WST is configured, including carrier arm 70, the pre-alignment unit (not shown), a carrier section that carries the wafer to the pre-alignment unit from the outside, and the like.

FIG. 6 shows the main configuration of a control system of exposure apparatus 100. The control system is mainly composed of main controller 20, which is made up of a microcomputer (or a workstation) that has overall control over the entire apparatus.

As is described above, the position of wafer table WTB and measurement table MTB within the XY plane can be measured at a resolution of 0.5 to 1 nm by each interferometer of interferometer system 118, however, because there are no reference marks for position measurement on liquid-repellent plate 50 in the embodiment, for example, it becomes difficult to restore wafer table WTB to a reference state (or to a state before the last interferometer beam moves away from wafer table WTB) after at least one interferometer has been reset, after the interferometer beams from all the Y-axis interferometers or all the X-axis interferometers move off the reflection surface of wafer table WTB. In addition, in the embodiment, because the periphery of liquid-repellent plate 50 projects outside wafer table WTB (reflection surface), it is difficult to control the position of wafer table WTB so that the outer periphery edge of liquid-repellent plate 50 does not touch other members. It is difficult to control the position of wafer table WTB, especially immediately after when liquid-repellent plate 50 is exchanged. In consideration of such points, in exposure apparatus 100 of the embodiment, main controller 20 measures the position of liquid-repellent plate 50 in the manner described below, and controls the position of wafer table WTB based on the measurement results.

Figure 7:
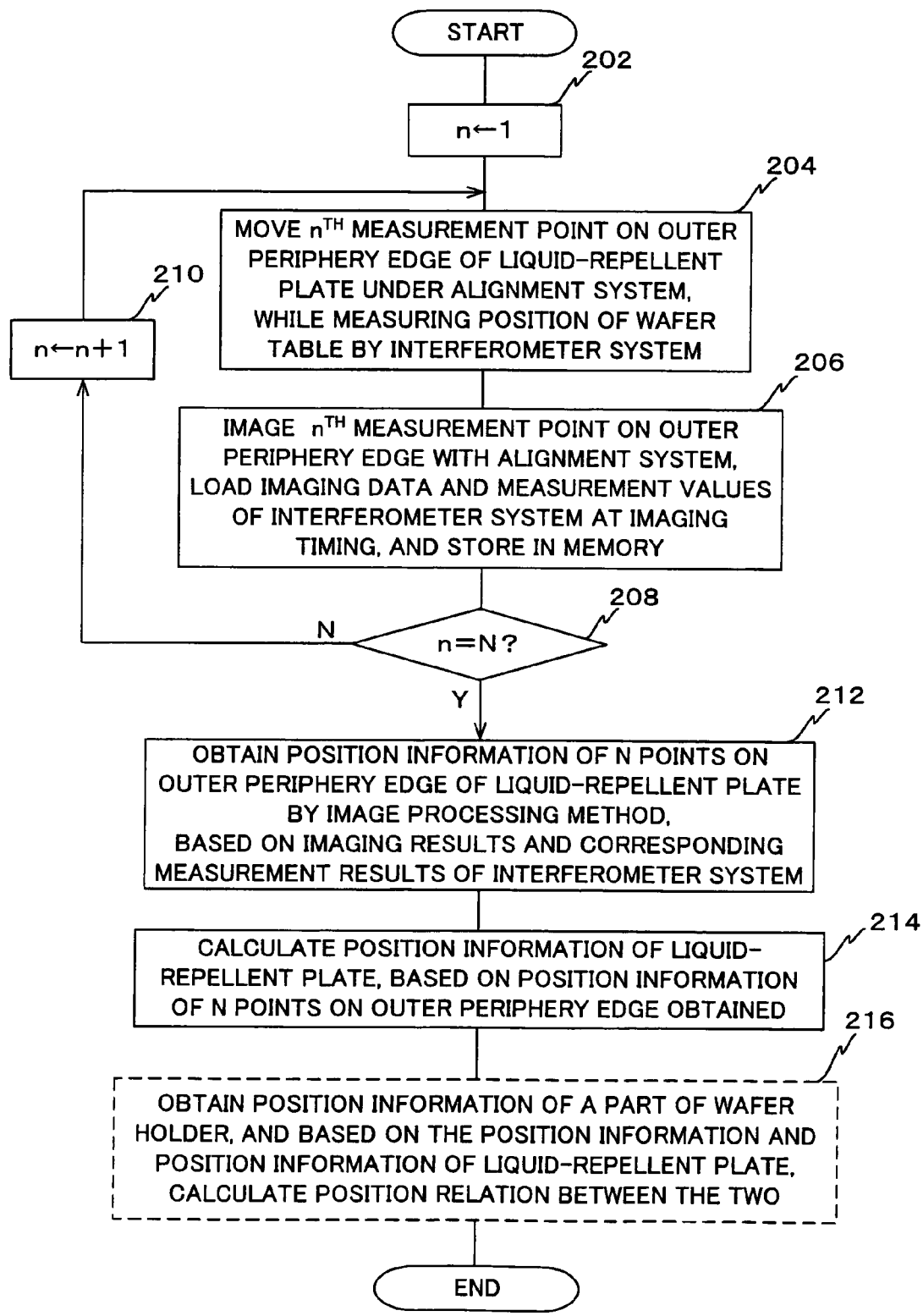
FIG. 7 is a flow chart that shows a processing algorithm of (a CPU inside) a main controller when a wafer table performs a recovery operation to a reference state.
Figure 8:
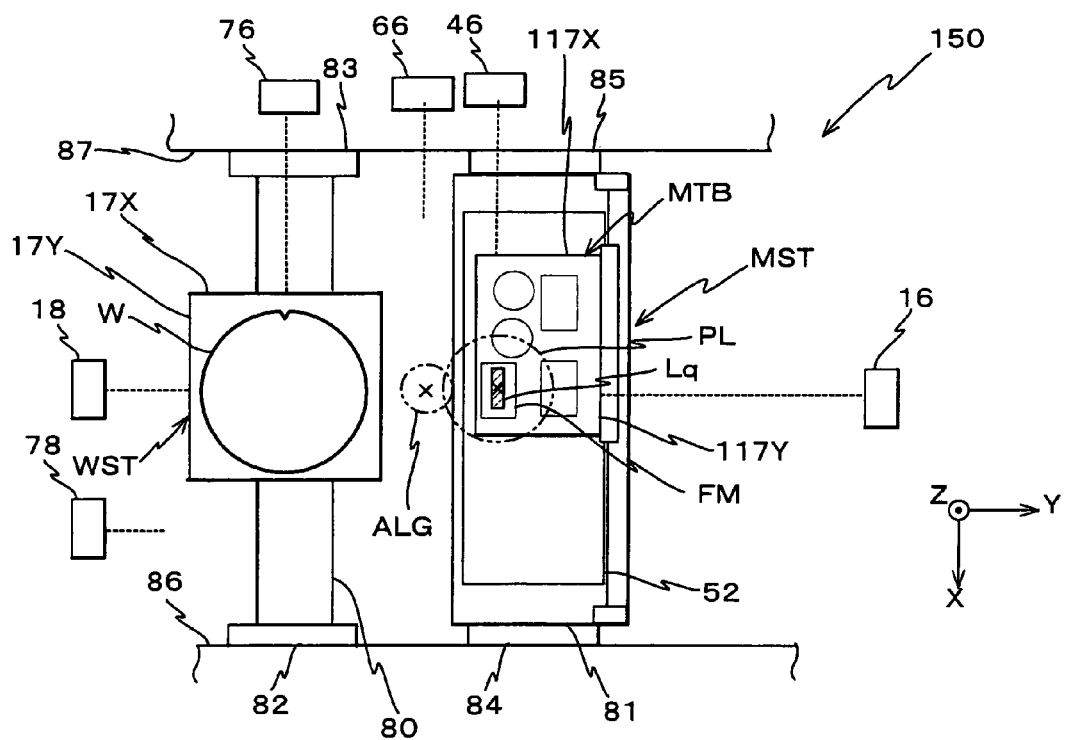
FIG. 8 is a view for describing conditions to start the processing algorithm shown in FIG. 7 that shows an example of a position of a wafer table WTB upon the start.

FIG. 7 shows an example of a flowchart of a processing algorithm of (the CPU inside) main controller 20 when the restoring operation of wafer table WTB to a reference state is performed, after liquid-repellent plate 50 has been exchanged. The processing algorithm is to begin when wafer stage WST moves to the position shown in FIG. 8, immediately after the measurement values of interferometer have been reset. At this stage, the position of wafer table WTB is controlled by main controller 20 based on the measurement values of interferometers 17 and 76. The rotation error of wafer table WTB itself in the θz direction is to be small enough to be ignored. In addition, as is previously described, when wafer table WTB (wafer stage WST) or the like moves, seamless preset of the measurement values of the interferometers previously described is performed, however, in the description of the processing algorithm below, in order to simplify the description, the description or the like related to the seamless preset of the measurement values of the interferometers will be omitted, and the position of wafer stage WST (wafer table WTB) is to be controlled on a stage coordinate system (X, Y) set by the measurement axes of interferometer system 118. There are no serious problems to such a premise, because the measurement values of adjacent X-axis interferometers and Y-axis interferometers are sequentially carried over by the seamless preset.

First of all, in step 202 in FIG. 7, a counter value n of a first counter that shows the measurement point number on the outer periphery edge of liquid-repellent plate 50 is initialized to 1 (n←1). In this case, as the number of areas subject to measurement, N, or to be more precise, 4 areas in this case, that is, the points in the center of each edge of liquid-repellent plate 50 vertically and horizontally are to be set.

In the next step, step 204, wafer stage WST is moved so that the $n^{th}$ (in this case, the $1^{st}$) measurement point on the outer periphery edge of liquid-repellent plate 50 is positioned directly under alignment system ALG, while the position of wafer table WTB is measured using interferometer system 118.

Figure 9A:
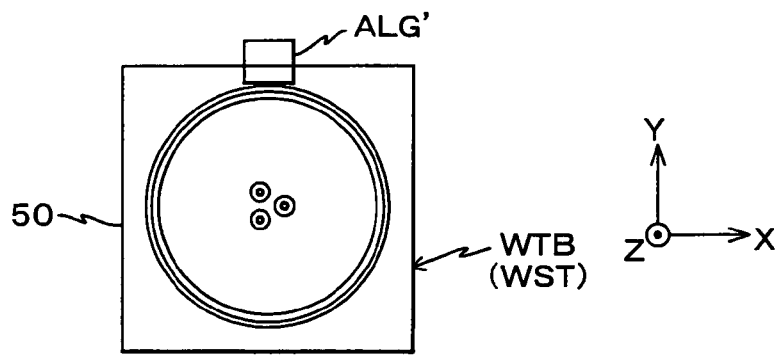
FIG. 9A is a view that shows a state where the position of the first measurement point is set in an imaging field of an alignment system when position information of the outer periphery edge of a liquid-repellent plate is obtained.
Figure 9B:
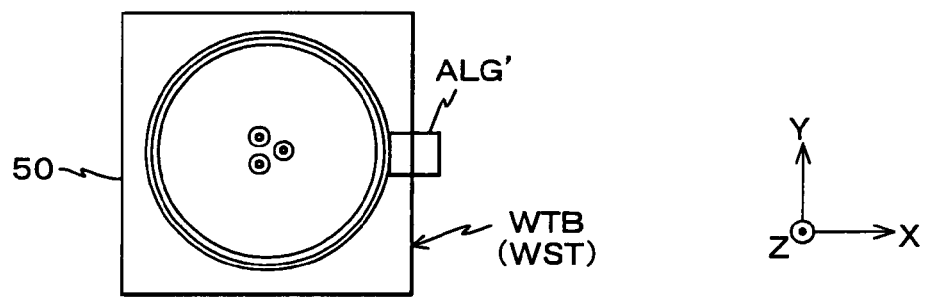
FIG. 9B is a view that shows a state where the position of the second measurement point is set in the imaging field of the alignment system when position information of the outer periphery edge of the liquid-repellent plate is obtained.
Figure 9C:
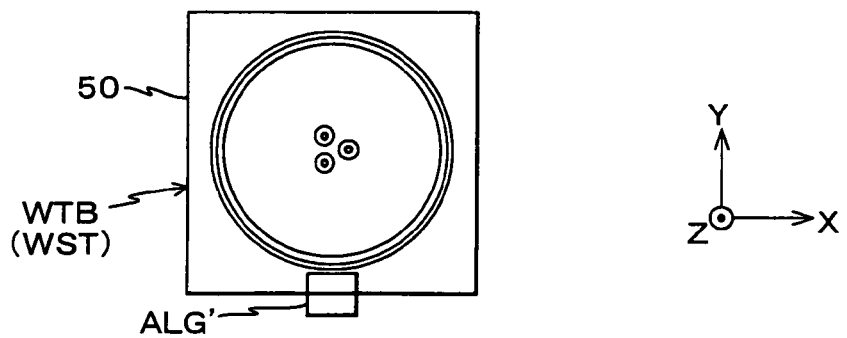
FIG. 9C is a view that shows a state where the position of the third measurement point is set in the imaging field of the alignment system when position information of the outer periphery edge of the liquid-repellent plate is obtained.
Figure 9D:
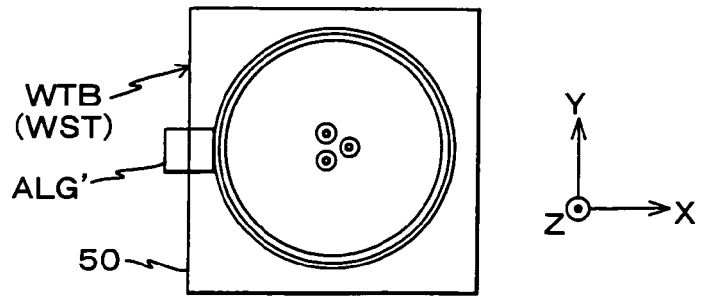
FIG. 9D is a view that shows a state where the position of the fourth measurement point is set in the imaging field of the alignment system when position information of the outer periphery edge of the liquid-repellent plate is obtained.

FIG. 9A shows the situation when the position of the $1^{st}$ measurement point on the outer periphery edge of liquid-repellent plate 50 on wafer table WTB (wafer stage WST) is set directly under alignment system ALG. In FIGS. 9B to 9D, the reference ALG' indicates the imaging field of alignment system ALG.

Referring back to FIG. 7, in step 206, the $n^{th}$ (in this case, the $1^{st}$) measurement point on the outer periphery edge is picked up using alignment system ALG, and the imaging data (imaging signals) is loaded, along with the measurement values of interferometer system 118 at this point. Both data are made to correspond with each other, and are stored in memory (not shown).

In the next step, step 208, the judgment is made whether or not counter value n of the first counter has reached N (in this case, N=4) or not. In this case, since n=1, the judgment here is denied, and the procedure then moves to step 210 where counter value n of the first counter is incremented by 1, and then the procedure returns to step 204.

Hereinafter, the loop processing of steps 204→206→208→210 is repeated until the judgment in step 208 is affirmed. Accordingly, from the position shown in FIG. 9A, wafer table WTB is sequentially positioned to each of the positions shown in FIGS. 9B, 9C, and 9D, and the outer periphery edge of liquid-repellent plate 50 is picked up using alignment system ALG, and the imaging data (imaging signals) is stored in memory with the position information (the measurement values of interferometer system 118) of wafer table WTB corresponding to the imaging data.

Then, when loading of the imaging data or the like of the edge on the −X side of liquid-repellent plate 50 shown in FIG. 9D is completed, the judgment in step 208 turns positive, and the procedure then moves to step 212.

In step 212, the position information of the $1^{st}$ to $N^{th}$ (in this case, the $4^{th}$) measurement point on the outer periphery of liquid-repellent plate 50 is obtained by an image processing method, based on the imaging data (imaging results) of each edge stored memory and the corresponding measurement results of interferometer system 118.

In the next step, step 214, based on the position information of the outer periphery edge at the obtained N points (in this case, 4 points), the position information or the like of liquid-repellent plate 50 such as for example, a predetermined reference point (e.g., the center point) of liquid-repellent plate 50 on the stage coordinate system (X, Y) is calculated, and then after such calculation, the processing in step 216 is performed when necessary, and then the processing shown in FIG. 7 is completed.

Then, based on the position information of the outer periphery edge of liquid-repellent plate 50 or the position information of liquid-repellent 50 measured in the matter described above, main controller 20 performs position control of wafer table WTB. For example, main controller 20 controls at least one of the position of wafer table WTB (wafer stage WST) and the position of measurement stage MST based the position information of the outer periphery edge of liquid-repellent plate 50 or the position information of liquid-repellent 50, so that the outer periphery edge of liquid-repellent plate 50 does not touch measurement stage WST.

In the case of performing the processing in step 216 above, the position information of a part of the wafer holder is to be obtained as in the position information of liquid-repellent plate 50 previously described, and based on the position information and the position information of liquid-repellent plate 50 obtained in step 212 or step 214 above, the position relation between wafer holder WH (wafer table WTB) and the liquid-repellent plate is to be calculated.

Figure 10A:
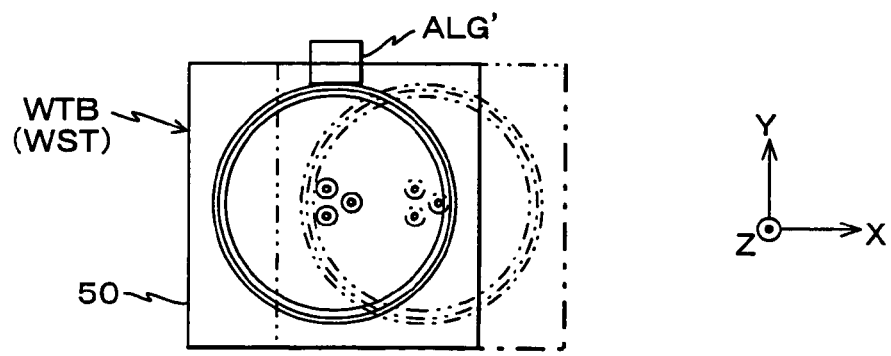
FIG. 10A is a view that shows a state of a movement of wafer table WTB when position information of a plurality of measurement points on an edge of the liquid-repellent plate on the +Y end side is sequentially measured.

In the case, for example, the θz rotation of liquid-repellent plate 50 is also measured, the measurement points on the outer periphery edge of liquid-repellent plate 50 are to be set at a plurality of points on at least one edge (that is, 5 or more in total), and then the processing is to be performed according to a flow chart similar to the one in FIG. 7 previously described. FIG. 10A shows the situation where wafer table WTB is moved when sequentially measuring the position information of the plurality of measurement points on the edge of liquid-repellent plate 50 on the +Y side edge section. And, in this case, in step 214 previously described, as the position information of liquid-repellent plate 50, in addition to the position information of the reference point described above, the θz rotation of the edge (that is, the rotation angle of liquid-repellent plate 50 with respect to the stage coordinate system) may also be calculated based on position information of at least two points on the edge where the plurality of points subject to measurement are set.

Figure 10B:
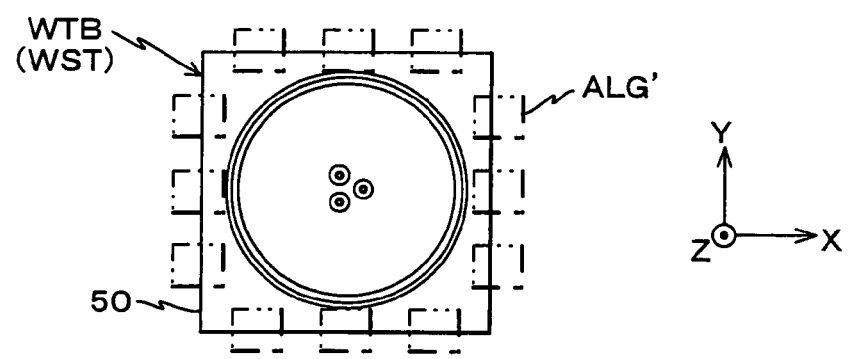
FIG. 10B is a view that shows a state in the case three measurement points are set on each of the four edges of the liquid-repellent plate.

In this case, the θz rotation of each edge can be obtained by setting the plurality of measurement points on each of the four edges of liquid-repellent plate 50. For example, as in the pattern shown in FIG. 10B, three measurement points can be set on each of the four edges and the average value of the θz rotation for each edge that has been obtained can be obtained. In actual, imaging field ALG' of alignment system ALG is fixed and wafer table WTB moves, however, FIG. 10B shows as if imaging field ALG' moves with respect to wafer table WTB, which is fixed for the sake of convenience.

In the embodiment, the outer periphery edge of liquid-repellent plate 50 is imaged at a plurality of points including two points symmetry to the virtual center of liquid-repellent plate 50. The imaging places, however, is not limited to this, and does not have to be two places symmetry to the virtual center of liquid-repellent plate 50. For example, the outer periphery edge may be imaged at a plurality of points including one point on one edge of the outer periphery of liquid-repellent plate 50 and another point on the opposite edge of the one edge. In this case, because a substantially symmetric image of at least two outer periphery edges that oppose each other can be obtained, position information (such as the center position) of liquid-repellent plate 50 can be calculated.

Figure 11:
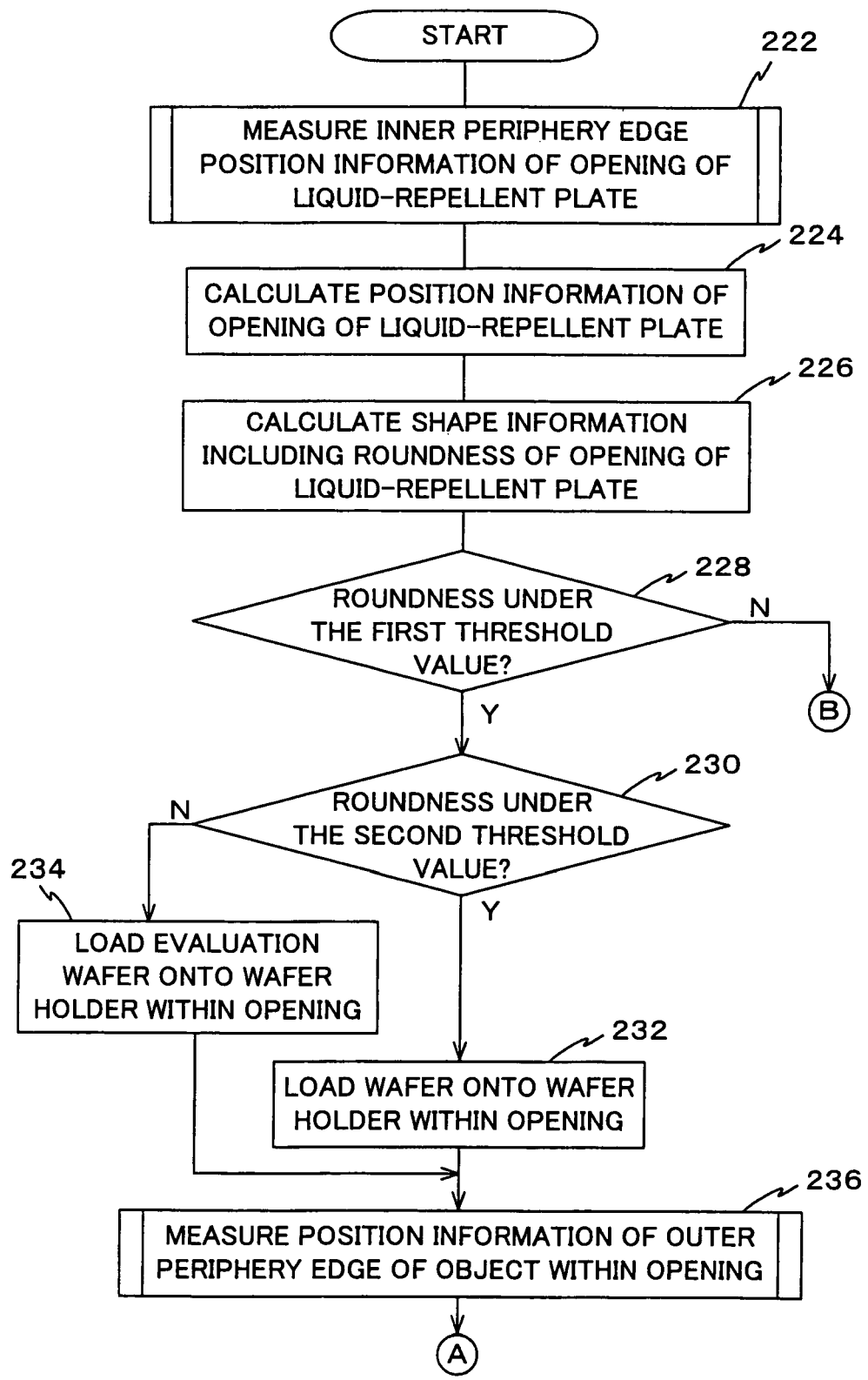
FIG. 11 is a flowchart (No. 1) that shows a processing algorithm of (a CPU inside) a main controller when a series of processing is performed during a period from a liquid-repellent plate exchange on a wafer table until the next liquid-repellent plate exchange.
Figure 12:
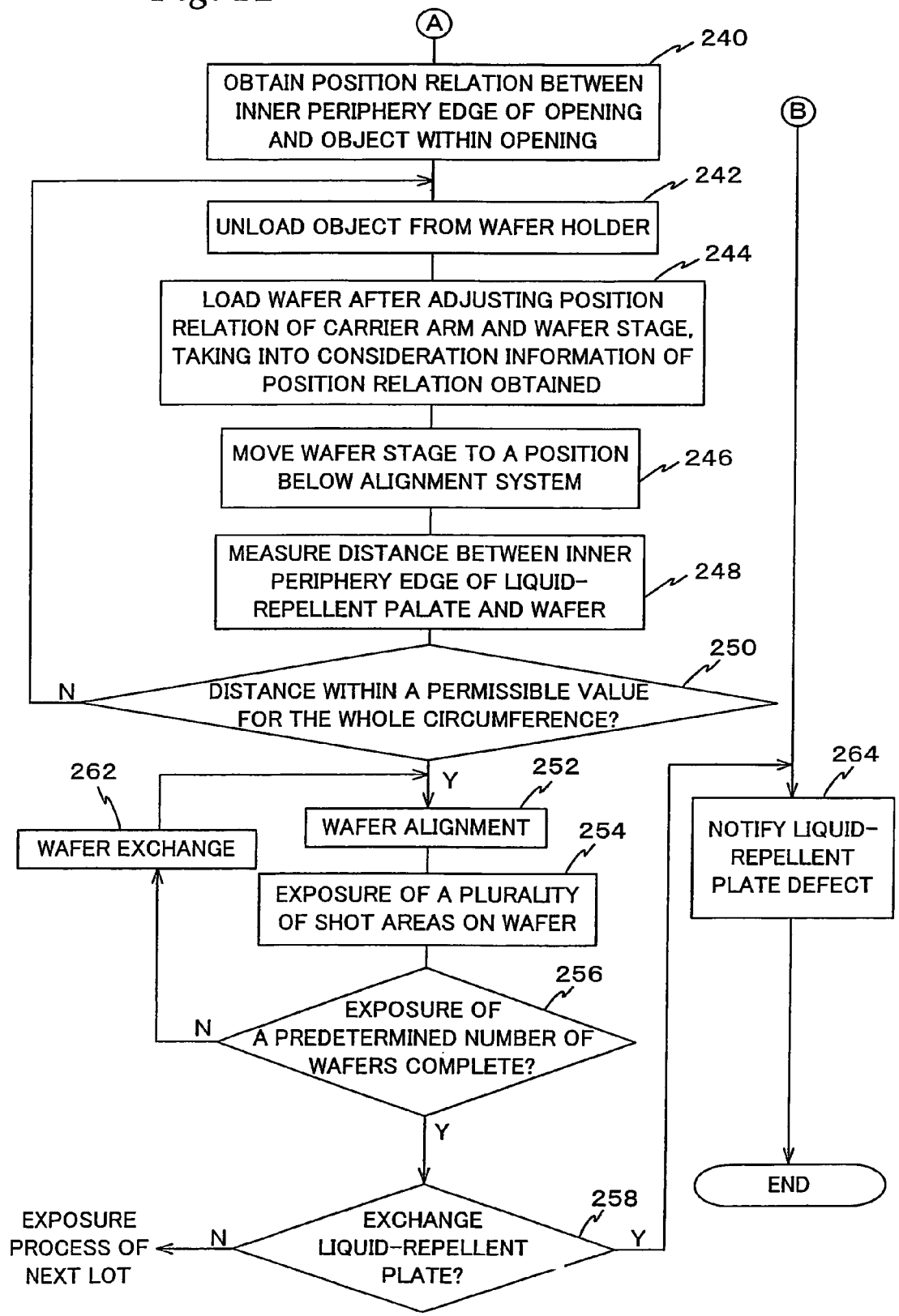
FIG. 12 is a flowchart (No. 2) that shows a processing algorithm of (a CPU inside) a main controller when a series of processing is performed during a period from a liquid-repellent plate exchange on a wafer table until the next liquid-repellent plate exchange.

Next, a series of processing performed in exposure apparatus 100 of the embodiment from when the liquid-repellent plate on wafer table WTB is exchanged until the next exchange of the liquid-repellent plate is performed is described, based on the flowchart in FIGS. 11 and 12 that show the processing algorithm of (the CPU inside) main controller 20 while referring to other drawings as appropriate. In the description of the processing algorithm below, descriptions on seamless preset of the measurement values of the interferometers previously described will be omitted, and the position of wafer stage WST (wafer table WTB) is to be controlled on the stage coordinate system (X, Y) set by the measurement axes of interferometer system 118.

First of all, in step 222 in FIG. 11, a subroutine for measuring the position information of the inner periphery edge of the opening of the liquid-repellent plate is performed.

Figure 13:
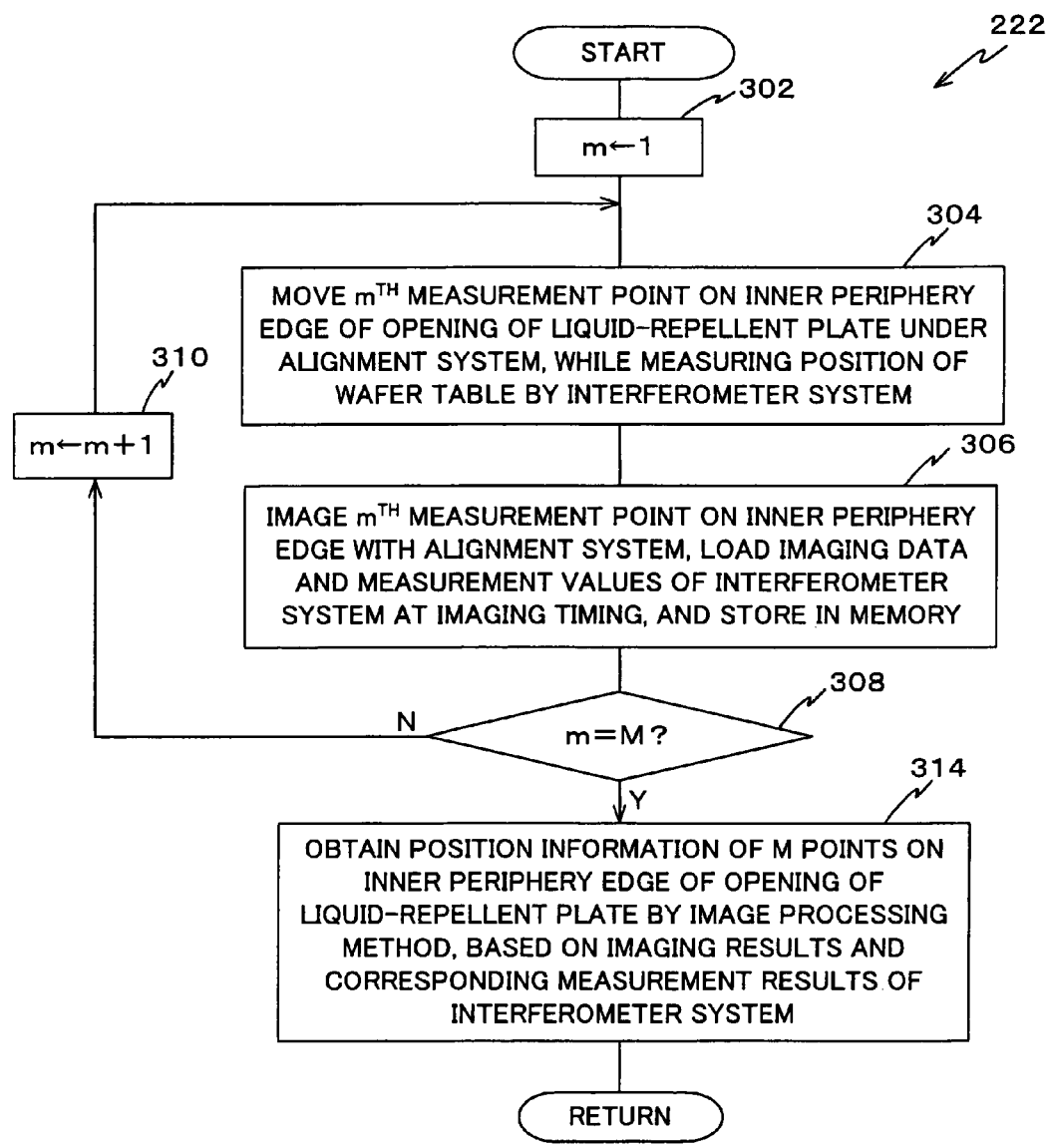
FIG. 13 is a flowchart that shows a subroutine of step 222.

In the subroutine of step 222, firstly, in step 302 in FIG. 13, a counter value m of a second counter that shows the order of the measurement points of the inner periphery edge of opening 50a of liquid-repellent plate 50 is initialized to 1 (m←1). As the measurement points, M points, or in this case, eight points, which are intersecting points of eight lines that radially extend in eight directions including the horizontal and vertical directions at a center angle of 45° from the center of opening 50a of liquid-repellent plate 50 and the inner periphery edge, are decided.

In the next step, step 304, wafer table WTB (wafer stage WST) is moved so that the $m^{th}$ (in this case, the $1^{st}$) measurement point on the inner periphery edge of opening 50a of liquid-repellent plate 50 is positioned directly under alignment system ALG, while the position of wafer table WTB is measured using interferometer system 118.

Figure 15A:
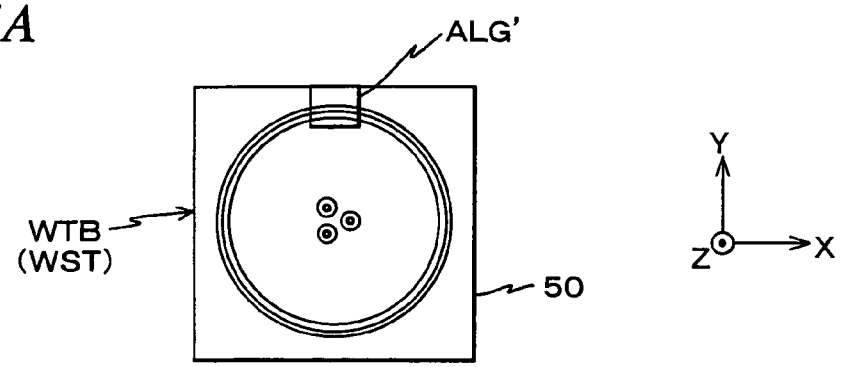
FIG. 15A is a view that shows a state where the position of the first measurement point is set in an imaging field of an alignment system when position information of the inner periphery edge of an opening of a liquid-repellent plate is obtained.
Figure 15B:
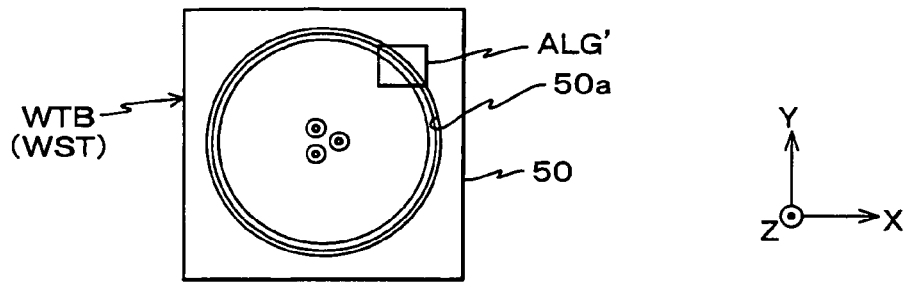
FIG. 15B is a view that shows a state where the position of the second measurement point is set in the imaging field of the alignment system when position information of the inner periphery edge of the opening of the liquid-repellent plate is obtained.
Figure 15C:
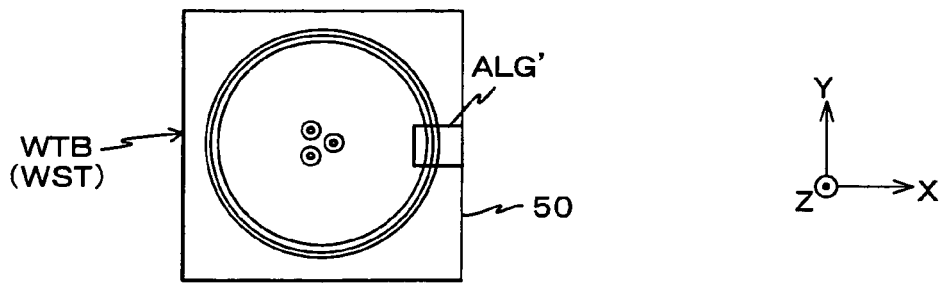
FIG. 15C is a view that shows a state where the position of the third measurement point is set in the imaging field of the alignment system when position information of the inner periphery edge of the opening of the liquid-repellent plate is obtained.
Figure 15D:
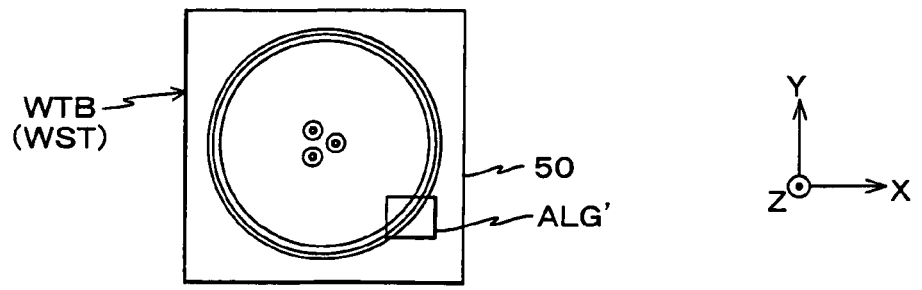
FIG. 15D is a view that shows a state where the position of the fourth measurement point is set in the imaging field of the alignment system when position information of the inner periphery edge of the opening of the liquid-repellent plate is obtained.

FIG. 15A shows the situation when the position of the $1^{st}$ measurement point is set within the imaging field of alignment system ALG. In FIGS. 15A to 15D and FIGS. 16A to 16D, the reference ALG' indicates the imaging field of alignment system ALG.

In the next step, step 306, the $m^{th}$ (in this case, the $1^{st}$) measurement point on the inner periphery edge of opening 50a is picked up using alignment system ALG, and the imaging data (imaging signals) is loaded, along with the measurement values of interferometer system 118 at this point. Both data are made to correspond with each other, and are stored in memory (not shown).

In the next step, step 308, the judgment is made whether or not counter value m of the second counter has reached M (in this case, M=8) or not. In this case, since m=1, the judgment here is denied, and the procedure then moves to step 310 where counter value m of the second counter is incremented by 1, and then the procedure returns to step 304.

Hereinafter, the loop processing of steps 304→306→308→310 is repeated until the judgment in step 308 is affirmed. Accordingly, from the position shown in FIG. 15A, wafer table WTB is sequentially positioned to each of the positions shown in FIGS. 15B, 15C, 15D, 16A, 16B, 16C, and 16D, and the inner periphery edge of opening 50a of liquid-repellent plate 50 is picked up using alignment system ALG, and the imaging data (imaging signals) is stored in memory with the position information (the measurement values of interferometer system 118) of wafer table WTB corresponding to the imaging data.

Figure 16A:
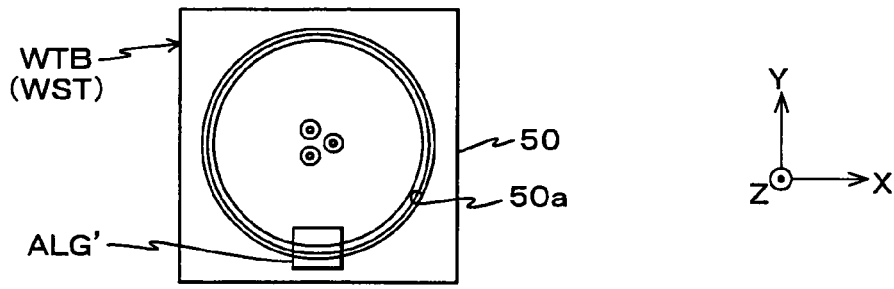
FIG. 16A is a view that shows a state where the position of the fifth measurement point is set in the imaging field of the alignment system when position information of the inner periphery edge of the opening of the liquid-repellent plate is obtained.
Figure 16B:
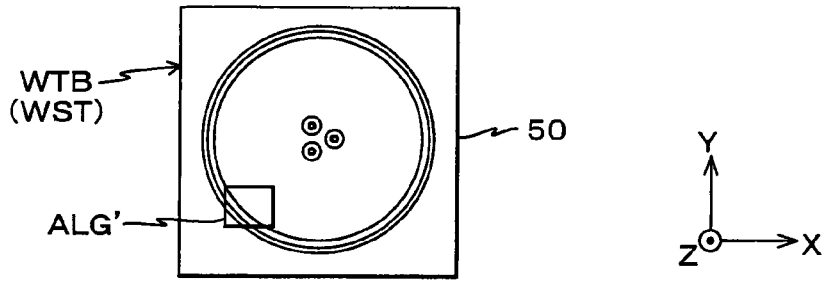
FIG. 16B is a view that shows a state where the position of the sixth measurement point is set in the imaging field of the alignment system when position information of the inner periphery edge of the opening of the liquid-repellent plate is obtained.
Figure 16C:
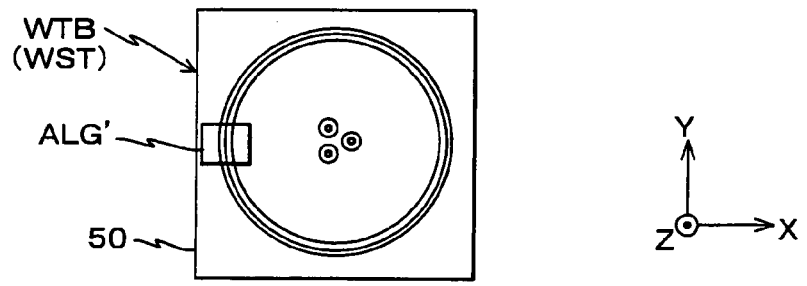
FIG. 16C is a view that shows a state where the position of the seventh measurement point is set in the imaging field of the alignment system when position information of the inner periphery edge of the opening of the liquid-repellent plate is obtained.
Figure 16D:
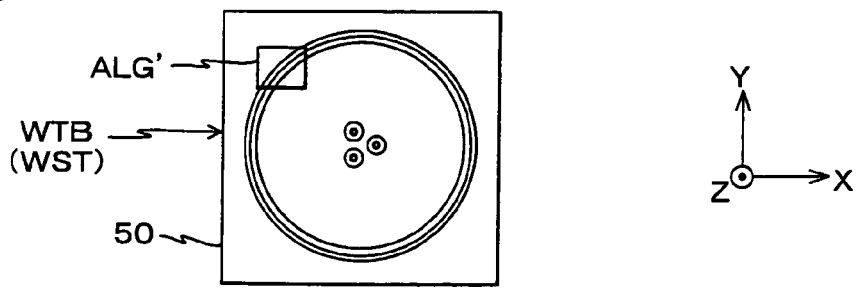
FIG. 16D is a view that shows a state where the position of the eighth measurement point is set in the imaging field of the alignment system when position information of the inner periphery edge of the opening of the liquid-repellent plate is obtained.
Figure 17A:
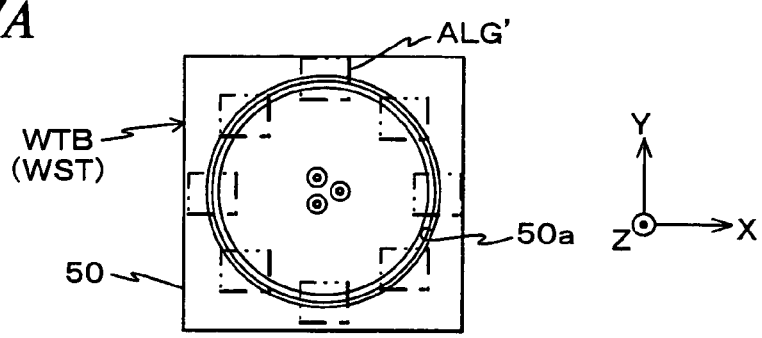
FIG. 17A is a schematic view that models a state where imaging data of eight points on an inner periphery edge of an opening of a liquid-repellent plate is obtained.

Then, when loading of the imaging data or the like of the $8^{th}$ measurement point on the inner periphery edge of opening 50a shown in FIG. 16D is completed, the judgment in step 308 turns positive, and the procedure then moves to step 314. As is modeled in FIG. 17A, the imaging data of the eight points on the inner periphery edge of opening 50a and the position information of wafer table WTB corresponding to the imaging data are stored in memory. In actual, imaging field ALG' of alignment system ALG is fixed and wafer table WTB moves, however, FIG. 17A shows as if imaging field ALG' moves with respect to wafer table WTB, which is fixed for the sake of convenience.

In step 314, after the position information of the $1^{st}$ to the $M^{th}$ (in this case, the $8^{th}$) measurement points on the inner periphery edge of opening 50a of liquid-repellent plate 50 is obtained by the image processing method, based on the imaging data (imaging results) of the M points (eight, in this case) on the inner periphery edge of opening 50a and measurement results of interferometer system 118 corresponding to the imaging data that are stored in memory, the processing in the subroutine is completed, and the subroutine returns to step 224 (refer to FIG. 11) in the main routine.

In step 224, based on the position information of the M points (in this case, eight points) on the inner periphery edge of opening 50a, for example, position information of opening 50a of liquid-repellent plate 50 such as the position information of a predetermined reference point (e.g., the center point) of opening 50a on the stage coordinate system (X, Y) is calculated (that is, based on the position information of the inner periphery edge, the position relation between the stage coordinate system set by interferometer system 118 and opening 50a is decided) by the least squares method or the like, and then the procedure then moves on to step 226.

In step 226, based on the position information of the M points (in this case, eight points) on the inner periphery edge of opening 50a described above, the shape information (the shape information includes at least the roundness of opening 50a) of opening 50a of liquid-repellent plate 50 is calculated by a predetermined calculation. Roundness, in this case, refers to an evaluation amount that shows the deviation of opening 50a from an ideal perfect circle, and it can be defined as the difference between the maximum radius and the minimum radius of the outline of opening 50a with respect to the center of opening 50a. The center of the circle, which is to be the reference of such roundness, may be a center calculated in one of the methods described below.

a. minimum zone circle (MZC) method: the center where when two concentric circles are positioned enclosing the outline of the opening, the radial departure of the concentric circles becomes a minimum b. least squares mean circle (LSC) method: the center of a least squares mean circle (a circle whose sum of the squares of the deviation from a reference circle is minimized)

c. minimum circumscribed circle (MCC) method: the center of a smallest possible circle which can be fitted around the outline of the opening d. maximum inscribed circle (MIC) method: the center of a circle of maximum radius that is totally enclosed by the outline of the opening.

In the next step, step 228, the judgment is made whether or not the roundness calculated in step 226 above is below a first threshold value or not. A value within in the limit of use as a liquid-repellent plate is decided as the first threshold value. Accordingly, in the case the judgment in step 228 is denied, then it means that liquid-repellent plate 50 is a plate whose level of roundness of the opening formed is insufficient and cannot be used in the exposure apparatus. Therefore, the procedure moves to step 264 in FIG. 12 where a notice, such as, for example, 'liquid-repellent plate defect (exchange required)' is shown on the display (not shown) so that the liquid-repellent plate defect is notified to the operator, and then the processing of the routine is completed. Then, by confirming the notice (display), the operator stops the operation of exposure apparatus 100, and then manually performs the exchange of liquid-repellent plate 50. In the case the exposure apparatus is equipped with a robot that can be used for exchanging liquid-repellent plate 50, main controller 20 can show the exchange period on the display, as well as stop the operation of the apparatus and then exchange the liquid-repellent plate, using the robot.

Meanwhile, in the case the judgment in step 228 is affirmed, the procedure then moves to the next step, step 230 where the judgment of whether the roundness calculated in step 226 above is below a second threshold value or not. And, in the case the judgment is denied, the procedure then moves to step 234 where a tool wafer W1 (refer to FIG. 17B) is loaded onto wafer holder WH inside opening 50a of liquid-repellent plate 50, using carrier arm 70 in carrier system 72 and center-ups 34a to 34c previously described. Then, the procedure moves to step 236 where a subroutine of measuring position information of the outer periphery edge of the object in the opening is performed. In this case, tool wafer W1 is a tool wafer that has a diameter (outer diameter) slightly smaller than that of wafer W, which is the object subject to processing used in device manufacturing. On the contrary, in the case the judgment is affirmed in step 230, the procedure then moves to step 232 where wafer W is loaded on wafer WH inside opening 50a of liquid-repellent plate 50, using carrier arm 70 in carrier system 72 and center-ups 34a to 34c previously described. Then, the procedure moves on to the subroutine in step 236. On this loading, the position of at least one of wafer table WTB and carrier arm 70 is controlled, based on the position information of the inner periphery edge of opening 50a obtained in step 222 or the position information f opening 50a obtained in step 224.

As is described, the second threshold value is decided for determining whether to choose tool wafer W1 or wafer W. In the case the roundness of opening 50a is high, then wafer W used in device manufacturing can be loaded without any problems on wafer holder WH inside opening 50a, however, in the case the roundness of opening 50a is low, when wafer W is to be loaded onto wafer WH inside opening 50a, the possibility is high of wafer W to come into contact with the inner periphery edge of opening 50a, and the loading may be difficult. Accordingly, in the latter case, tool wafer W1 whose diameter is smaller than wafer W is to be loaded on wafer holder WH.

Figure 14:
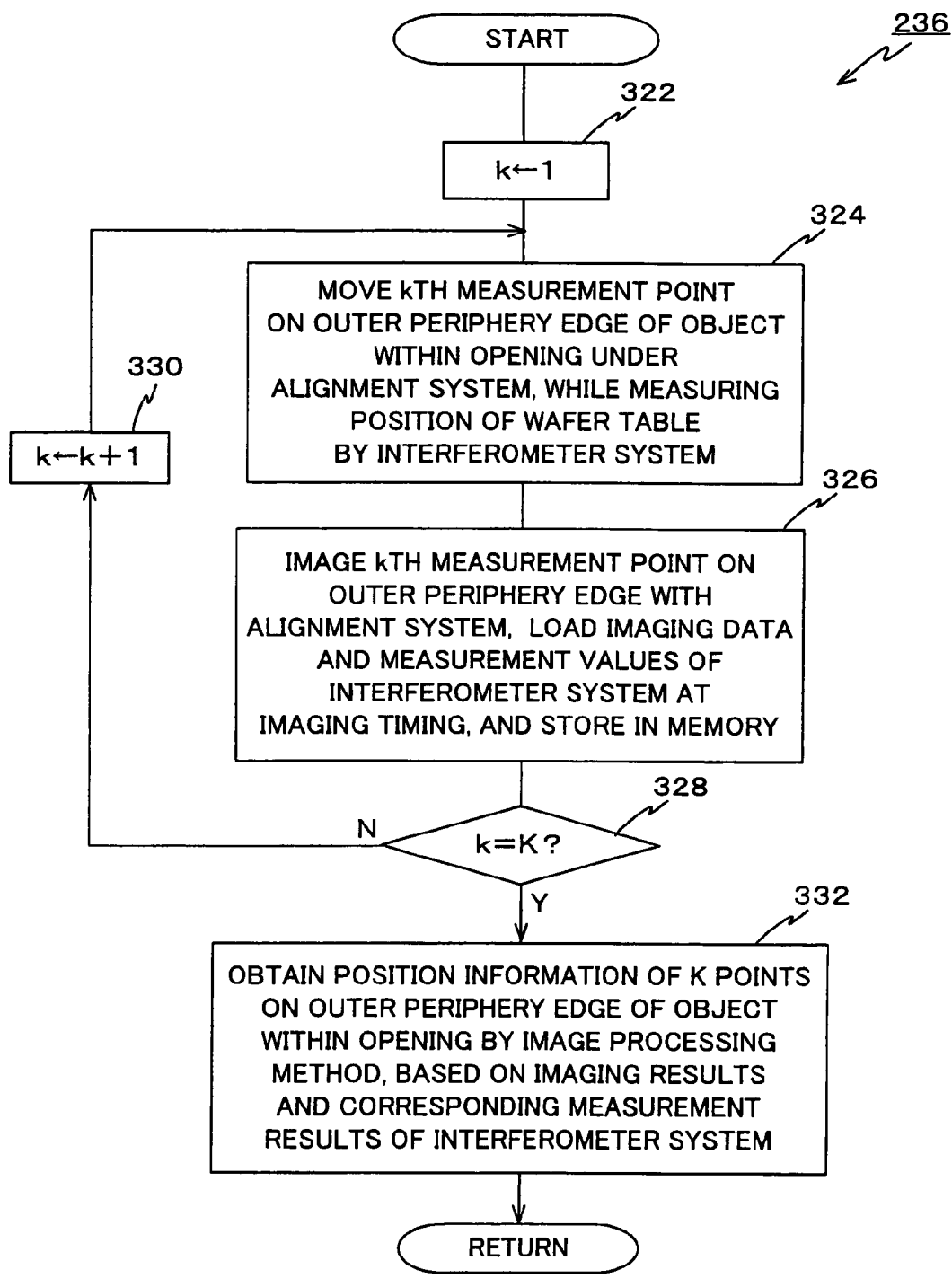
FIG. 14 is a flowchart that shows a subroutine of step 236.

In the subroutine in step 236, first of all, in step 322 in FIG. 14, a count value k of a third counted that shows the order of the measurement points of the outer periphery edge of the object inside opening 50a (tool wafer W1 or wafer W, hereinafter, representatively referred to as tool wafer W1 as appropriate) is initialized to 1 (k←1). As the measurement points, K points, or in this case, eight points, which are intersecting points of eight lines that radially extend in eight directions including the horizontal and vertical directions at a center angle of 45° from the center of tool wafer W1 and the outer periphery edge of tool wafer W1, are decided.

In the next step, step 324, wafer table WTB (wafer stage WST) is moved so that the $k^{th}$ (in this case, the $1^{st}$) measurement point on the outer periphery edge of tool wafer W1 within opening 50a of liquid-repellent plate 50 is positioned directly under alignment system ALG, while the position of wafer table WTB is measured using interferometer system 118.

In the next step, step 326, the $k^{th}$ (in this case, the $1^{st}$) measurement point on the outer periphery edge of tool wafer W1 is picked up using alignment system ALG, and the imaging data (imaging signals) is loaded, along with the measurement values of interferometer system 118 at this point. Both data are made to correspond with each other, and are stored in memory (not shown).

In the next step, step 328, the judgment is made whether or not counter value k of the third counter has reached K (in this case, K=8) or not. In this case, since k=1, the judgment here is denied, and the procedure then moves to step 330 where counter value k of the third counter is incremented by 1, and then the procedure returns to step 324.

Figure 17B:
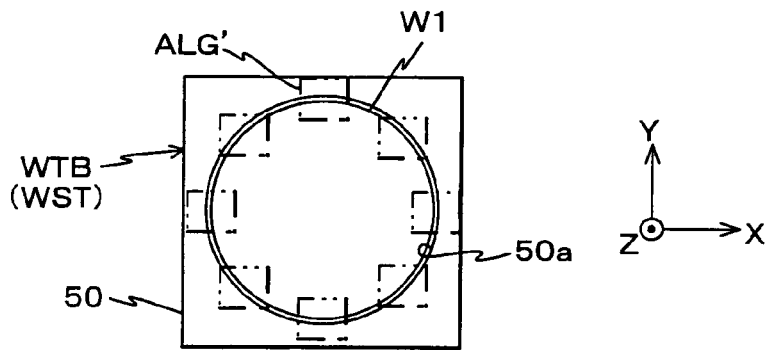
FIG. 17B is a schematic view that models a state where imaging data of eight points on an outer periphery edge of a tool wafer is obtained.

Hereinafter, the loop processing of steps 324→326→328→330 is repeated until the judgment in step 328 is affirmed. Accordingly, as is shown in FIG. 17B, wafer table WTB is sequentially positioned to a position where each of the eight measurement points is positioned within imaging field ALG' of alignment system ALG, and the outer periphery edge of tool wafer W1 is picked up at each position-setting position using alignment system ALG, and the imaging data (imaging signals) is stored in memory with the position information (the measurement values of interferometer system 118) of wafer table WTB corresponding to the imaging data.

Then, when the imaging data of the eighth point of the outer periphery edge has been loaded, the judgment in step 328 is affirmed, and then the procedure moves to step 332.

In step 332, after the position information of the $1^{st}$ to the $K^{th}$ (in this case, the $8^{th}$) measurement points on the outer periphery edge of the object inside opening 50a is obtained by the image processing method, based on the imaging data (imaging results) of the K points (eight, in this case) on the outer periphery edge of the object inside opening 50a and measurement results of interferometer system 118 corresponding to the imaging data that are stored in memory, the processing in the subroutine is completed, and the subroutine returns to step 240 (refer to FIG. 12) in the main routine.

In step 240, the position relation between the inner periphery edge of opening 50a and the object inside opening 50a is obtained. More specifically, based on the position information of the K points (in this case, eight points) on the outer periphery edge of the object in opening 50a, such as, based on the position information of the object (position information of the center of the object on the stage coordinate system (X,Y)) calculated by the least squares method or the like and the position information of opening 50a ((position information of the center of opening 50a on the stage coordinate system (X, Y)) of liquid-repellent plate 50 obtained in step 224 previously described, the position relation between the inner periphery edge of opening 50a and the object within 50a, such as the information on deviation between the center of opening 50a and the center of the object (tool wafer W1 or wafer W).

In the next step, step 242, wafer stage WST is moved to the wafer exchange position, and the object (tool wafer W1 or wafer W) is unloaded from wafer holder WH, using carrier arm 70 of carrier system 72 and center-ups 34a to 34c.

In the next step, step 244, exposure of a lot (wafers of a predetermined number) begins.

In step 244, wafer W serving as a first substrate subject to exposure on which pre-alignment (center detection and rotation adjustment) has been performed by the pre-alignment unit (not shown) constituting a part of carrier system 72 is carried using carrier arm 70, to a position above wafer stage WST, located at the wafer exchange position. Then, by taking into consideration the information on position relation of the inner periphery edge of opening 50a and the object inside opening 50a obtained in step 240 described above, such as the information on deviation previously described, the position relation between carrier arm 70 and wafer stage WST is adjusted and wafer W is loaded onto wafer holder WH arranged on wafer table WTB from carrier arm 70. In this case, the adjustment of the position relation between carrier arm 70 and wafer stage WST is performed by adjusting both or either one of the positions of carrier arm 70 and wafer stage WST. Accordingly, by loading wafer W after the position relation of carrier arm 70 and wafer stage WST on loading wafer W is adjusted, normally, it becomes possible to load wafer W on wafer holder WH inside the inner periphery edge of opening 50a of liquid-repellent plate 50 above wafer table WTB (inside the depressed section on the upper surface of wafer table WTB) in a manner that the outer periphery edge of wafer W and the inner periphery edge (the inner periphery edge of depressed section 140 on the upper surface of wafer table WTB) of liquid-repellent plate 50a do not come into contact, and the outer periphery edge of wafer W and the inner periphery edge of opening 50a are also distanced at a predetermined value, such as, less than around 0.3 mm.

In the next step, step 246, wafer stage WST is moved so that it is located under alignment system ALG.

In the next step, step 248, the distance between the inner periphery edge of opening 50a of liquid-repellent plate 50 and (the outer periphery of) wafer W is measured across the entire circumference of wafer W in the same procedure as the position measurement of the outer periphery edge of wafer W and the like previously described, using alignment system ALG. In this case, it is especially important to arrange at least a plurality sets of measurement points that are in directions different from that of the eight directions from the wafer center on measuring the outer periphery edge or the wafer or the inner periphery edge of the opening as is previously described.

Then, in the next step, step 250, the judgment of whether the distance across the entire circumference of the wafer is within a permissible range or not is made, based on the measurement results in step 248 above. As is previously described, normally, because wafer W is loaded on wafer holder WH so that the outer periphery edge of wafer W and the inner periphery edge (the inner periphery edge of depressed section 140 on the upper surface of wafer table WTB) of liquid-repellent plate 50a do not come into contact, and the outer periphery edge of wafer W and the inner periphery edge of opening 50a are also distanced at, such as, less than around 0.3 mm, the judgment made in step 250 is affirmative, and the procedure then moves on to the next step, step 252.

Meanwhile, the judgment made in step 250 based on the measurement results of step 248 may turn out to be negative, due to the outer diameter error or the like of wafer W. Accordingly, in the case the judgment in step 250 results negative, the procedure then moves to step 242 previously described, and the first wafer W is unloaded from the wafer holder. Then, the operations of steps 224, 246, 248, and 250 are performed on the second wafer W as is previously described. In this case, in step 244, when the second wafer W is loaded onto the wafer stage (wafer holder), the position relation between the carrier arm and the wafer stage is adjusted taking into consideration the measurement results related to the first wafer W obtained in step 248. And, when the judgment related to the second wafer W in step 250 is affirmed, the procedure then moves to step 252.

In step 252, alignment marks on wafer W are detected using alignment system ALG, and by detecting the position information of the alignment marks based on the detection results and the measurement values of interferometer system 118 on detection, wafer alignment, such as Enhanced Global Alignment (EGA), is performed.

In the next step, step 254, based on the position information of a plurality of shot areas on wafer W obtained as the results of the wafer alignment referred to above, the latest baseline measurement results of alignment system ALG, and the like, the movement operation in between shots in order to move wafer stage WST to the scanning starting position (acceleration starting position) of each shot area and the scanning exposure operation for transferring the pattern formed on reticle R onto each shot area by the scanning exposure method are repeatedly performed, and exposure of a plurality of shot areas on wafer W by the step-and-scan method is performed. On this exposure, water is constantly supplied to the space below tip lens 91 of projection optical system PL.

In the next step, step 256, the judgment of whether or not exposure of all the wafers in one lot has been completed is made. And, when the judgment turns out to be negative, the procedure then moves on to step 262 where wafer W held on wafer holder WH of wafer table WTB that has been exposed is exchanged with a new wafer, and then the procedure moves to step 252 where the processing in the loop of steps 252→254→256→262 is hereinafter repeated until the judgment in step 256 is affirmed.

Meanwhile, in the case the judgment in step 256 referred to above is affirmed, the procedure then moves on to step 258.

In the next step, step 258, the judgment of whether or not the timing of exchange of the liquid-repellent plate is due is made, referring to, for example, the irradiation record of illumination light IL. In the embodiment, the relation between the deterioration of the water-repellent coating on the surface of liquid-repellent plate 50 and the integrated energy amount irradiated on the surface of liquid-repellent plate 50 is obtained in advance by experiment, and based on the relation and the irradiation record of illumination light IL, the judgment that the timing of exchange of liquid-repellent plate 50 is due is to be made just before the water-repellent coating deteriorates.

Then, in the case when the judgment is made that the timing of exchange is due, the procedure then moves to step 264 previously described, and when the judgment is made that the timing has not come yet, the procedure moves on to the processing of the next lot.

In the manner described above, the series of processing from exchanging the liquid-repellent plate to the next exchange is executed.

As is obvious from the description so far, in the embodiment, main controller 20, or to be more precise, the CPU inside main controller 20 and the software executed by the CPU make up at least a part of each unit such as an outer periphery edge position obtaining unit, an inner periphery edge position obtaining unit, a decision-making unit, a shape calculation unit, an object outer periphery edge position obtaining unit, a distance measurement unit, a stage controller, a controller, and the like. However, it is a matter of course that at least a part of the components made up by such software may also be constituted by hardware.

As is described above, according to exposure apparatus 100 of the embodiment, main controller 20 detects a part of liquid-repellent plate 50 using alignment system ALG while measuring the position of wafer table WTB (wafer stage WST) on which liquid-repellent plate 50 is detachably installed using interferometer system 118. And then, based on the detection results and the measurement results of interferometer system 118 corresponding to the detection results, the position information of the outer periphery edge of liquid-repellent plate 50 is obtained (steps 204 to 210). Therefore, it becomes possible to control the position of liquid-repellent plate 50, or in other words, the position of wafer table WTB (wafer stage WST) on the movement coordinate system (stage coordinate system) set by the interferometer system based on the position information of the outer periphery edge of liquid-repellent plate 50, even if there are no marks for position measurement on wafer table WTB (wafer stage WST) as in the embodiment.

In addition, in the case the outer periphery of liquid-repellent plate 50 projects outward than wafer table WTB as in the embodiment, the position of wafer table WTB wafer stage WST) can be controlled so that the outer periphery edge of liquid-repellent plate 50 does not touch other members (such as measurement stage MST).

It is also a matter of course that the position information of the outer periphery of liquid-repellent plate 50 can be obtained in the manner described above, even in the case when marks for position measurement are arranged on wafer table WTB (wafer stage WST) or liquid-repellent plate 50 or when the outer periphery of liquid-repellent plate 50 does not project outward than wafer table WTB.

In addition, according to exposure apparatus 100 of the embodiment, main controller 20 detects a part of liquid-repellent plate 50 using alignment system ALG while measuring the position of wafer table WTB using interferometer system 118. And then, based on the detection results and the measurement results of interferometer system 118 corresponding to the detection results, the position information of the inner periphery edge of opening 50a of liquid-repellent plate 50 is obtained (step 222). Therefore, it becomes possible to calculate the position and the shape of opening 50a (refer to steps 224 and 226), based on the position information of the inner periphery edge.

In addition, in exposure apparatus 100 of the embodiment, in the case, for example, when the roundness is below the second threshold value, main controller 20 loads wafer W on wafer holder WH (step 232) inside opening 50a of liquid-repellent plate 50 on wafer stage WST (wafer table WTB) via carrier system 72, based on the position information of the inner periphery edge of opening 50a of liquid-repellent plate 50. Accordingly, it becomes easier to load wafer W inside opening 50a of liquid-repellent plate 50 on wafer stage WST than when the information related to the inner periphery edge of opening 50a of liquid-repellent plate 50 is not take into consideration.

In addition, in exposure apparatus 100 of the embodiment, in the case the position relation between the inner periphery edge of opening 50a and the object inside opening 50a (tool wafer W1 or wafer W) is obtained (refer to step 240), main controller 20 loads the wafer adjusting the position relation of carrier arm 70 and the wafer table by controlling at least either wafer table WTB or carrier arm 70 of carrier system 72 taking into consideration the position relation referred to above, when carrying wafer W to wafer table WTB by carrier system 72 (refer to step 244). Accordingly, based on the position relation that has been obtained, it becomes possible to load the wafer within the depressed section 140 of wafer table WTB, that is, within the inner periphery edge of opening 50a of liquid-repellent plate 50 at a desired position relation. In this case, it becomes possible to load wafer W on wafer holder WH within the inner periphery edge (within the depressed section on the upper surface of wafer table WTB) of opening 50a of liquid-repellent plate 50 above wafer table WTB, so that the outer periphery edge of wafer W and the inner periphery edge (the inner periphery edge of the depressed section on the upper surface of wafer table WTB) of liquid-repellent plate 50a do not come into contact, and the outer periphery edge of wafer W and the inner periphery edge of opening 50a are also distanced at a predetermined value, such as, less than around 0.3 mm.

In the operations described referring to FIGS. 11 and 12, when tool wafer W1 is mounted on the wafer holder, the first threshold value and the second threshold value are set with respect to the shape (roundness) of opening 50a. However, the judgment of whether to mount tool wafer W1 or not can be made using only one of the threshold values. In this case, tool wafer W1 can be a wafer with a smaller diameter than that of wafer W subject to exposure, or a wafer that has substantially the same diameter as wafer W subject to exposure.

In addition, in the operations described referring to FIGS. 11 and 12, tool wafer W1 is mounted on the wafer holder after the shape information of opening 50a is obtained, however, such a process of obtaining shape information can be omitted. In this case as well, a wafer with a smaller diameter than that of wafer W subject to exposure or a wafer that has substantially the same diameter as wafer W subject to exposure can be used as tool wafer W1.

In addition, in the operations described referring to FIGS. 11 and 12, tool wafer W1 is mounted on the wafer holder after the position information and the shape information of opening 50a are obtained, however, obtaining the position information and the shape information of opening 50a can be omitted, and the position information of the opening and the position relation (including the distance) of the inner periphery edge of the opening and the outer periphery edge of tool wafer W1 can be obtained, after tool wafer W1 is mounted on the wafer holder. As a matter of course, the shape information of opening 50a can be obtained if necessary. In this case, as tool wafer W1, it is desirable for the wafer to be a wafer whose diameter is smaller than that of wafer W subject to exposure, however, the wafer may be a wafer of substantially the same diameter as wafer W subject to exposure.

In addition, in the operations described referring to FIGS. 11 and 12, the position relation (distance) between the inner periphery edge of opening 50a and wafer W is measured when wafer W serving as a first substrate subject to exposure is mounted on the wafer holder. However, in the case wafer W serving as the substrate subject to exposure can be loaded onto the predetermined position within opening 50a, the measurement operation (steps 246, 248, and 250) can be omitted.

In addition, in the operations described referring to FIGS. 11 and 12, in step 258, the judgment is made whether or not to exchange liquid-repellent plate 50 after the exposure processing of one lot has been completed. Step 258, however, may be omitted, and the judgment can be made at a predetermined time interval, or the liquid-repellent plate may be exchanged after the elapse of a predetermined period, without making any judgment of whether or not the exchange is necessary.

And, according to exposure apparatus 100, exposure of wafer W mounted within the inner periphery edge (within the depressed section on the upper surface of wafer table WTB) of opening 50a of liquid-repellent plate 50 above wafer table WTB as is described above is performed (step 254), by irradiating illumination light IL on wafer W. Accordingly, leakage of liquid (water) Lq from the space between wafer W and liquid-repellent plate 50 can be suppressed during exposure, and by the immersion exposure, since exposure is performed with high resolution and a greater depth of focus compared with when exposure is performed in the air, the pattern of reticle R can be transferred with good precision on the wafer, and for example, with an ArF excimer laser beam, a fine pattern that has a device rule of around 45 to 100 nm can be transferred.

According to exposure apparatus 100 of the embodiment, since only minimum component members required for exposing the wafer, such as the wafer holder, need to be arranged on wafer stage WST (wafer table WTB), the size and weight of wafer stage WST can be reduced, which makes it possible to reduce the size of the drive mechanism (motors) that drive the wafer stage as well as reduce the heat generated from the motors, which in turn can suppress the thermal deformation of wafer stage WST and degradation of exposure to the utmost.

Figure 18:
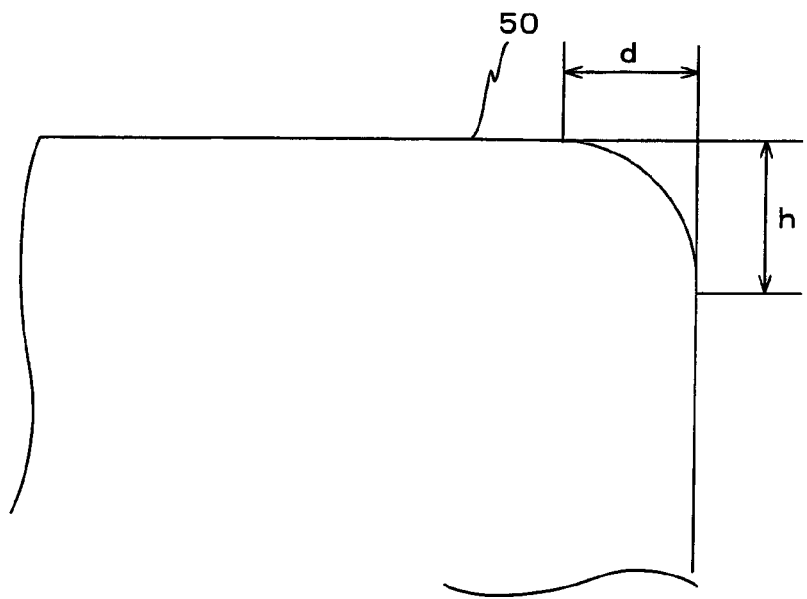
FIG. 18 is an enlarged side view of a vicinity of an outer periphery edge section of a liquid-repellent plate.

In the embodiment above, the case has been described where a plurality of measurement points is set on the outer periphery edge of liquid-repellent plate 50 and the position information is obtained for the measurement points. The present invention, however, is not limited to this, and for example, at a position on the inner side of the outer periphery edge position on the upper surface of liquid-repellent plate 50, a mark whose position relation with the outer periphery edge is known, such as a line-shaped mark parallel to the outer periphery edge at a position a predetermined distance (referred to as D) away from the outer periphery edge, can be formed. And, at least one measurement point can be set on the mark and the position information measured, and the position of the outer periphery edge can be obtained based on the measurement results and distance D described above. As is shown in FIG. 18, on liquid-repellent plate 50 in the vicinity of the edge, there are many cases where there is a curved surface (or an oblique surface) of a width d and height h, and because height h is approximately 0.1 mm, the image of the edge may be blurred in the case the depth of focus of alignment system ALG is shallow. In such a case, the line-shaped mark referred to above can be set at a position where D is greater than d (D>d), and the line-shaped mark can be imaged by alignment system ALG. As a matter of course, the mark is not limited to the line-shaped mark described above, and the mark may be of any shape, as long as the position relation with the outer edge periphery is known.

Similarly, for the inner periphery edge of opening 50a of liquid-repellent plate 50, a mark whose position relation with the inner periphery edge can be formed in advance, and the position information of at least one measurement point on the mark may be obtained. For example, a line of a circle concentric with opening 50a may be formed a predetermined distance outside the inner periphery edge of opening 50a.

In addition, on detecting the position information such as the outer periphery edge of liquid-repellent plate 50, it is desirable to use a focal point detection system that alignment system ALG has. In the case, however, when the detection beam of the focal point detection system of alignment system ALG moves away from liquid-repellent plate 50, it is desirable to perform the so-called shift focus operation where the position of the measurement points is set within the imaging field of alignment system ALG after focus alignment is performed once at a position where the detection beam can be irradiated on the surface of liquid-repellent plate 50.

In addition, in the embodiment above, the case has been described where the position information of each measurement point is obtained by the image processing method using the imaging results of the image of the outer periphery of liquid-repellent plate 50, the inner periphery edge of opening 50a, or the outer periphery edge of tool wafer W1 or wafer W picked up using alignment system ALG consisting of a sensor by the FIA system. However, as the detection unit, sensors other than the FIA system, such as a unit that detects reflection light or scattered light may also be used. Further, in the case of using the FIA system, the method of detecting the reflected light from the object by downward illumination may naturally be used, however, it is also possible to illuminate the edge of liquid-repellent plate 50 from below and detect the transmitted light above liquid-repellent plate 50.

In the embodiment descried above, at least one of the exchange operation of liquid-repellent plate 50 and the various measurements of liquid-repellent plate 50 may be performed in a state without liquid Lq on the image plane side of projection optical system PL, or the operation may be performed in a state with liquid Lq held in the space between measurement table MTB and projection optical system PL. In the case of keeping liquid Lq held in the space between measurement table MTB and projection optical system PL, because the tip surface of projection optical system PL can be maintained in a wet state, not only can water marks or the like be kept from being generated but also the operation of total recovery and re-supply of liquid Lq can be omitted.

In addition, in the embodiment described above, the case has been described where wafer table WTB constitutes the first stage (and a moving body) on which the plate whose position information of the outer periphery edge is detected is detachably mounted, and measurement stage MST constitutes the second stage. However, the present invention is not limited to this, and measurement table MTB may constitute the first stage (and the moving body). That is, the position information of the outer periphery edge of a plate detachably mounted on measurement table MTB may be obtained. In this case, the movement of measurement table MTB can be controlled, based on the position information of the outer periphery edge. In this case, at least one of the plate exchange operation of measurement table MTB and the various measurements of the plate may be performed in a state without liquid Lq on the image plane side of projection optical system PL, or the operation may be performed in a state with liquid Lq held in the space between wafer table WTB and projection optical system PL.

The exchange operation of liquid-repellent plate 50 of wafer table WTB or the measurement operation of the outer periphery edge of liquid-repellent plate 50 and the inner periphery edge of opening 50a of liquid-repellent plate 50 may be performed in a state where liquid Lq is held in the space between measurement table MTB and projection optical system PL.

Figure 19A:
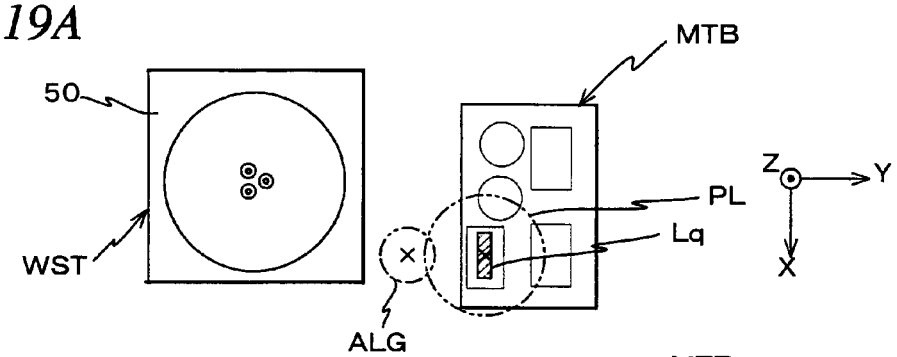
FIG. 19A is a view (No. 1) for describing a modified example.
Figure 19B:
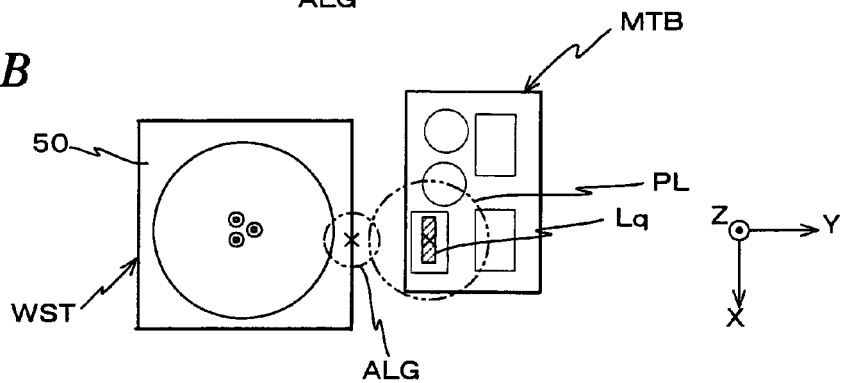
FIG. 19B is a view (No. 2) for describing a modified example.

More specifically, when liquid-repellent plate 50 is exchanged on the side of wafer table WTB, the position of measurement table MTB is controlled so that liquid Lq is positioned above measurement table MTB, as is shown in FIG. 19A. Then after the exchange of liquid-repellent plate 50 has bee completed, the outer periphery edge of liquid-repellent plate 50 on the side (the +Y side) of measurement table MTB (measurement stage MST) is measured, using alignment system ALG, as is shown in FIG. 19B. With this operation, it becomes possible to move wafer table WTB (wafer stage WST) closer to measurement table MTB (measurement stage MST).

Figure 19C:
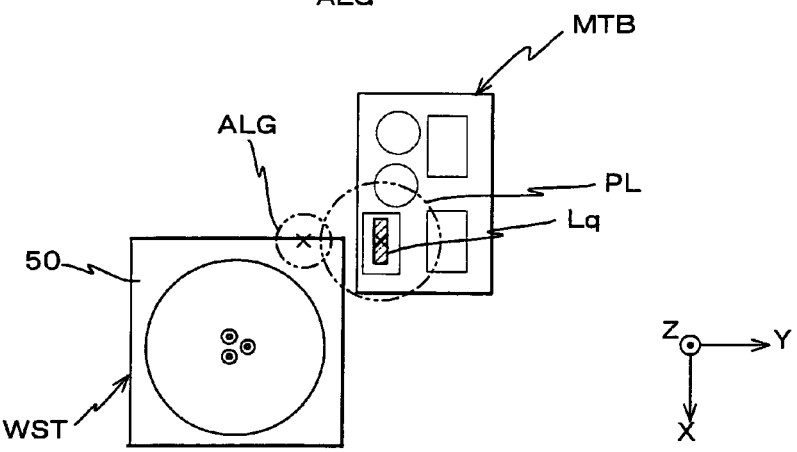
FIG. 19C is a view (No. 3) for describing a modified example.
Figure 19D:
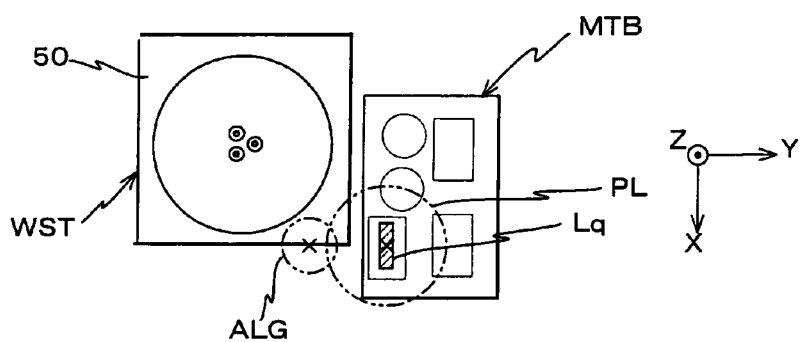
FIG. 19D is a view (No. 4) for describing a modified example.

Next, the outer periphery edge of liquid-repellent plate 50 on the −X side and the outer periphery edge of liquid-repellent plate 50 on the +X side are sequentially measured using alignment system ALG, as is shown in FIGS. 19C and 19D.

Then, based on the position information of the three points on the outer periphery edge of liquid-repellent plate 50 obtained in the manner described above or the position information of liquid-repellent plate 50 obtained from the position information above, main controller 20 subsequently performs position control of wafer table WTB (wafer stage WST).

Figure 20A:
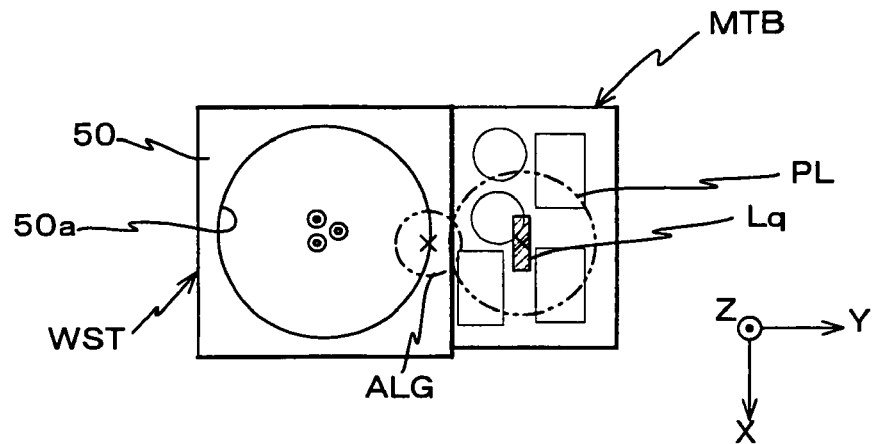
FIG. 20A is a view (No. 5) for describing a modified example.
Figure 20B:
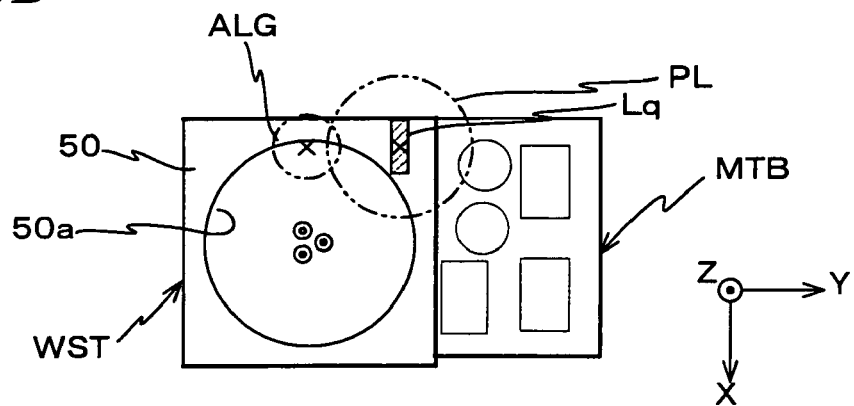
FIG. 20B is a view (No. 6) for describing a modified example.
Figure 20C:
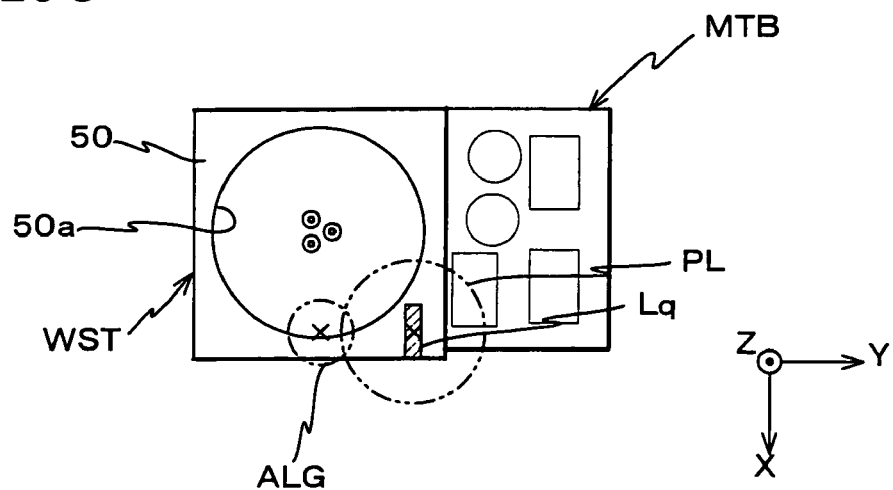
FIG. 20C is a view (No. 7) for describing a modified example.

After the position information of the outer periphery edge of liquid-repellent plate 50 is measured as is described above, for example, wafer stage WST and measurement stage MST are integrally moved while maintaining a state where (liquid-repellent plate 50 of) wafer table WTB and measurement table MTB come into contact with (or are close to) each other, and the inner periphery edge of opening 50a of liquid-repellent plate 50 on the +Y side is measured using alignment system ALG, as is shown in FIG. 20A. Next, both stages WST and MST are sequentially moved integrally, while maintaining the state where (liquid-repellent plate 50 of) wafer table WTB and measurement table MTB come into contact with (or are close to) each other, and the inner periphery edge of opening 50a of liquid-repellent plate 50 on the −X side and the inner periphery edge on the +X side are sequentially measured using alignment system ALG, as is shown in FIGS. 20B and 20C. In this case, since there is no wafer mounted on wafer table WTB, liquid Lq cannot be positioned at the point where the wafer is mounted, however, because the inner periphery edge can be measured as is shown in FIGS. 20A to 20C, it is possible to load wafer on wafer holder WH in a manner similar to the embodiment above based on the measurement results.

As is described above, by performing the exchange operation of liquid-repellent plate 50 of wafer table WTB and the measurement operation of the outer periphery edge of liquid-repellent plate 50 or the inner periphery edge of opening 50a of liquid-repellent plate 50 in a state with liquid Lq held in the space between measurement table MTB and projection optical system PL, the recovery operation and the supply operation of the liquid will not be necessary, which means that the time required for the operations can be cut, which in turn makes it possible to increase the throughput in the exposure process.

As is described above, after the outer periphery edge of liquid-repellent plate 50 and the inner periphery edge of opening 50*a* are measured and the wafer is loaded on wafer holder WH, the movement range in a state where liquid-repellent plate 50 of wafer stage WST (wafer table WTB) on which the wafer is loaded and measurement table MTB come into contact with each other broadens. That is, it becomes possible to position liquid Lq on the entire surface of wafer table WTB. Accordingly, measurement using the measurement method according to the flowcharts in FIGS. 7, 11, and 12 described in the above embodiment may be performed again. Such an arrangement makes it possible to perform measurement with high precision.

In addition, in the embodiment above, the case has been described where the measurement points for position information are set at a plurality of areas symmetry to the center for each of the outer periphery of liquid-repellent plate 50, the inner periphery of opening 50*a*, and the outer periphery edge of tool wafer W1 or wafer W. Such an arrangement was employed, however, merely because an improvement in the measurement accuracy could be expected by the averaging effect when calculating the position of each center point, and it is a matter of course that the present invention is not limited to this.

In addition, in the embodiment above, the case has been described where the shape of liquid-repellent plate 50 is substantially a square and opening 50*a* is a circle. The shape of the plate, however, may be a circle, a polygon, or any other shape, and the opening also may be of any shape as long as the shape corresponds to the object subject to processing. For example, in the case a liquid crystal display device is the object subject to processing, the shape of the opening can be a square according to the shape of the glass plate, serving as the object subject to processing.

In addition, in the embodiment above, the case has been described where plate 50 is detachable to wafer table WTB, however, plate 50 may be formed integral with wafer table WTB. In this case as well, the position information of the inner periphery edge of the depressed section formed in order to mount wafer W on wafer table WTB can be detected, as is shown in FIGS. 11 and 13.

In addition, in the embodiment above, the series of operations including measuring the position information of the outer periphery edge of the plate described using FIG. 7 and the series of operations including measuring the position information of the inner periphery edge of the opening of the plate described using FIG. 11 do not necessarily have to be performed together, and performing only one of the series of operations is acceptable.

In the embodiment above, the case has been described where the present invention is applied to a liquid immersion exposure apparatus, however, the scope of the present invention is not limited to this, and the present invention can be suitably applied to a typical scanning stepper which is not of the immersion type. In this case, instead of the liquid-repellent plate, a plate that does not have a liquid-repellent surface formed can be used.

In addition, in the embodiment above, the case has been described where the stage unit is equipped with a wafer stage and a measurement stage. However, the present invention is not limited to this, and the stage unit may be equipped with at least one wafer stage for holding the wafer, without being equipped with the measurement stage. In the case the stage unit is equipped with a plurality of wafer stages, at least one of the plate exchange operation and the various measurement operations on one of the stages may be performed in a state without liquid Lq on the image plane side of projection optical system PL, or the operation may be performed in a state where the other stage is arranged below projection optical system PL (on the image plane side) and liquid Lq is held in the space between the projection optical system and the other wafer stage.

In addition, in the embodiment above, the case has been described where the arrangement of leveling table 52 having six degrees of freedom and measurement table MTB having three degrees of freedom are employed. The present invention, however, is not limited to this, and the arrangement of leveling table 52 having three degrees of freedom and measurement table MTB having three degrees of freedom may also be employed. Further, the arrangement of measurement table MTB having six degrees of freedom, without arranging leveling table 52, may also be employed.

In the embodiment above, pure water (water) is used as the liquid, however, as a matter of course, the present invention is not limited to this. As the liquid, a liquid that is chemically stable, having high transmittance to illumination light IL and safe to use, such as a fluorine containing inert liquid may be used. As such as a fluorine-containing inert liquid, for example, Fluorinert (the brand name of 3M United States) can be used. The fluorine-containing inert liquid is also excellent from the point of cooling effect. In addition, as the liquid, a liquid which has high transmittance to illumination light IL and a refractive index as high as possible, and furthermore, a liquid which is stable against the projection optical system and the photoresist coated on the surface of the wafer (for example, cederwood oil or the like) can also be used. Further, in the case the $F_2$ laser is used as the light source, fombrin oil may be chosen.

In addition, in the embodiment above, the liquid that has been recovered may be reused. In this case, it is desirable to arrange a filter for removing impurities from the liquid that has been recovered in the liquid recovery unit, in the recovery pipes, or the like.

In the embodiment above, the optical element of projection optical system PL closest to the image plane side is tip lens 91. The optical element, however, is not limited to lenses, and it may be an optical plate (parallel plane plate) used for adjusting the optical properties of projection optical system PL such as aberration (such as spherical aberration, coma, or the like), it may simply be a cover glass. The surface of the optical element of projection optical system PL closest to the image plane side (tip lens 91 in the embodiment above) may be smudged by coming into contact with the liquid (water, in the embodiment above) due to scattered particles generated from the resist by the irradiation of illumination light IL or adherence of impurities in the liquid. Therefore, the optical element is to be fixed freely detachable (exchangeable) in the lowest section of barrel 40, and may be exchanged periodically.

In such a case, when the optical element that comes into contact with the liquid is a lens, the cost for replacement parts is high, and the time required for exchange becomes long, which leads to an increase in the maintenance cost (running cost) as well as a decrease in throughput. Therefore, the optical element that comes into contact with the liquid may be, for example, a parallel plane plate, which is less costly than lens 91.

In addition, in the embodiment above, the case has been described where the present invention is applied to a scanning exposure apparatus by the step-and-scan method or the like. It is a matter of course, that the present invention is not limited to this, and more specifically, the present invention can also be applied to a projection exposure apparatus by the step-and-repeat method, an exposure apparatus by the step-and-stitch method, an exposure apparatus by the proximity method, and the like.

As the usage of the exposure apparatus, it is not limited to exposure apparatus for manufacturing semiconductor devices, and for example, the present invention can be widely applied to an exposure apparatus for manufacturing liquid crystal displays which transfers a liquid crystal display device pattern onto a square shaped glass plate, and to an exposure apparatus for manufacturing organic EL, thin-film magnetic heads, imaging devices (such as CCDs), micromachines, DNA chips, and the like. In addition, the present invention can also be suitably applied to an exposure apparatus that transfers a circuit pattern onto a glass substrate or a silicon wafer not only when producing microdevices such as semiconductors, but also when producing a reticle or a mask used in exposure apparatus such as an optical exposure apparatus, an EUV exposure apparatus, an X-ray exposure apparatus, or an electron beam exposure apparatus.

The light source of the exposure apparatus in the embodiment above is not limited to the ArF excimer laser, and a pulsed laser light source such as a KrF excimer laser (output wavelength 248 nm), an $F_2$ laser (output wavelength 157 nm), an $Ar_2$ laser (output wavelength 126 nm), and $Kr_2$ laser (output wavelength 146 nm), or the like, or an ultra high-pressure mercury lamp that generates a bright line such as the g-line (wavelength 436 nm) or the i-line (wavelength 365 nm) can also be used. In addition, a harmonic generating unit or the like of a YAG laser can also be used. In addition, a harmonic wave may also be used that is obtained by amplifying a single-wavelength laser beam in the infrared or visible range emitted by a DFB semiconductor laser or fiber laser, with a fiber amplifier doped with, for example, erbium (or both erbium and ytteribium), and by converting the wavelength into ultraviolet light using a nonlinear optical crystal. Further, the projection optical system is not limited to a reduction system, and the system may be either an equal magnifying system or a magnifying system.

In addition, in the embodiment above, the case has been described of an exposure apparatus that uses a mask (reticle) of the light transmitting type, which is a substrate of the light transmitting type where a predetermined light-shielding pattern (or a phase pattern or an extinction pattern) is formed. However, the present invention can also be applied to an exposure apparatus that uses an electronic mask (a variable shaped mask) which forms a transmittance pattern, a reflection pattern, or an emission pattern, based on the electronic data of the pattern that is to be exposed as is disclosed in, for example, U.S. Pat. No. 6,778,257, instead of the reticle above.

In addition, as is disclosed in the pamphlet of International Publication No. WO 01/035168, by forming interference fringes on wafer W, the present invention can also be applied to an exposure apparatus (a lithography system) that forms line-and-space patterns on wafer W.

In the embodiment above, the case has been described where the position measurement method, the measurement method, and the loading method of the present invention are applied to an exposure apparatus. However, the present invention is not limited to this, and the position measurement method of the present invention can be applied to a unit as long as the unit is equipped with a moving body on which a plate of a predetermined shape is detachably mounted, and the measurement method and the loading method of the present invention can be applied to a unit as long as the unit is equipped with a moving body on which a plate that has an opening formed for placing an object is detachably mounted.

Semiconductor devices are manufactured through the following steps: a step where the function/performance design of a device is performed; a step where a reticle based on the design step is manufactured; a step where a wafer is manufactured using materials such as silicon; a lithography step where the pattern formed on the mask is transferred onto a photosensitive object by the exposure apparatus described in the embodiment above; a device assembly step (including processes such as dicing process, bonding process, and packaging process); inspection step, and the like. In this case, in the lithography step, because the exposure apparatus and the exposure method in the embodiment above are used, exposure with high precision can be achieved for over a long period of time. Accordingly, the productivity of high-integration microdevices on which fine patterns are formed can be improved.

While the above-described embodiment of the present invention is the presently preferred embodiment thereof, those skilled in the art of lithography systems will readily recognize that numerous additions, modifications, and substitutions may be made to the above-described embodiment without departing from the spirit and scope thereof. It is intended that all such modifications, additions, and substitutions fall within the scope of the present invention, which is best defined by the claims appended below.

What is claimed is:

1. A method for determining an offset between a center of a substrate and a center of a depressed section on a moving body, comprising:
   providing a test substrate to the depressed section, the test substrate having a dimension smaller than a dimension of the depressed section;
   measuring a position of the test substrate while in the depressed section; and
   determining the offset between the center of the substrate and the center of the depressed section from the position of the test substrate.

2. The method according to claim 1, wherein providing the test substrate to the depressed section comprises loading the test substrate inside the depressed section using a substrate handler.

3. The method according to claim 1, wherein measuring the position of the test substrate comprises measuring the position of an edge of the test substrate relative to a reference mark of the moving body or vice versa.

4. The method according to claim 1, further comprising: determining a position of the center of the depressed section relative to a position of a reference mark of the moving body or vice versa; and, determining a position of the center of the test substrate relative to the position of an edge of the test substrate or vice versa.

5. The method according to claim 4, wherein measuring the position of the center of the test substrate is performed with a prealigner.

6. The method according to claim 1, wherein the dimension of the test substrate is such that, when the test substrate is in the depressed section, a gap between an edge of the test substrate and an edge of the depressed section is greater than a maximum offset.

7. The method according to claim 1, wherein measuring the position of the test substrate includes measuring a position of an edge of the test substrate by an optical system.

8. The method according to claim 7, wherein the optical system comprises an interferometer and an optical alignment system.

9. The method according to claim 1, further comprising calibrating a substrate handler to take into account the offset.

10. The method according to claim 9, wherein calibrating the substrate handler includes shifting a positioning of substrates by the substrate handler to correct for the offset so that a subsequent substrate provided by the substrate handler to the depressed section is substantially centered inside the depressed section.

* * * * *